US011664401B2

United States Patent
Yun et al.

(10) Patent No.: US 11,664,401 B2
(45) Date of Patent: May 30, 2023

(54) IMAGE SENSOR AND ELECTRONIC DEVICE INCLUDING THE SAME

(71) Applicant: SAMSUNG ELECTRONICS CO., LTD., Suwon-si (KR)

(72) Inventors: Seokho Yun, Hwaseong-si (KR); Sookyoung Roh, Yongin-si (KR); Hongkyu Park, Hwaseong-si (KR); Minwoo Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 148 days.

(21) Appl. No.: 17/173,688

(22) Filed: Feb. 11, 2021

(65) Prior Publication Data

US 2021/0249459 A1    Aug. 12, 2021

(30) Foreign Application Priority Data

Feb. 11, 2020  (KR) .................. 10-2020-0016627
Sep. 17, 2020  (KR) .................. 10-2020-0120027

(51) Int. Cl.
*H01L 27/146* (2006.01)
*G02B 26/00* (2006.01)
(Continued)

(52) U.S. Cl.
CPC ...... *H01L 27/14627* (2013.01); *G02B 26/004* (2013.01); *G02B 27/1013* (2013.01);
(Continued)

(58) Field of Classification Search
CPC ......... H01L 27/14627; H01L 27/14645; H01L 27/14605; H01L 27/14625;
(Continued)

(56) References Cited

U.S. PATENT DOCUMENTS 8,289,422 B2   10/2012  Hiramoto et al.
8,767,114 B2 *  7/2014  Hiramoto ............. H04N 9/0455
                                                348/336

(Continued)

FOREIGN PATENT DOCUMENTS

EP       2955551 A1    12/2015
KR    1020170044392 A   4/2017
(Continued)

OTHER PUBLICATIONS

Communication dated Jun. 22, 2021 issued by the European Patent Office in European Application No. 21156212.9.
(Continued)

*Primary Examiner* — Nhan T Tran
(74) *Attorney, Agent, or Firm* — Sughrue Mion, PLLC

(57) ABSTRACT

An image sensor includes: a light detector including a plurality of photosensitive cells configured to sense light; a color separation lens array provided above the light detector and including a plurality of pattern structures, the color separation lens array being configured to collect light having different wavelength spectra respectively on at least two photosensitive cells of the plurality of photosensitive cells; and a variable interlayer element configured to adjust an optical distance between the light detector and the color separation lens array.

24 Claims, 39 Drawing Sheets

(51) Int. Cl.
  *G02B 27/10* (2006.01)
  *G02B 27/12* (2006.01)
  *H04N 9/01* (2023.01)
  *H04N 23/84* (2023.01)

(52) U.S. Cl.
  CPC ...... *G02B 27/123* (2013.01); *H01L 27/14645* (2013.01); *H04N 9/01* (2023.01); *H04N 23/84* (2023.01)

(58) Field of Classification Search
  CPC ......... H01L 27/14621; H01L 27/14643; H01L 27/14806; G02B 26/004; G02B 27/1013; G02B 27/123; H04N 9/0451; H04N 9/077; H04N 5/2253; H04N 5/2254
  See application file for complete search history.

(56) References Cited

U.S. PATENT DOCUMENTS

| | | | |
|---|---|---|---|
| 10,229,476 | B2 | 3/2019 | Mendlovic et al. |
| 10,705,406 | B2 | 7/2020 | Kim et al. |
| 2010/0309554 | A1 | 12/2010 | Nagai et al. |
| 2012/0206637 | A1 | 8/2012 | Hiramoto et al. |
| 2012/0212656 | A1 | 8/2012 | Hiramoto et al. |
| 2014/0284455 | A1* | 9/2014 | Hiramoto ............ H04N 9/07 257/432 |
| 2016/0064448 | A1* | 3/2016 | Shin ............ H01L 27/14625 257/292 |
| 2017/0092676 | A1* | 3/2017 | Yun ............ H01L 27/14625 |
| 2017/0179178 | A1* | 6/2017 | Park ............ G02B 27/1013 |
| 2021/0124179 | A1 | 4/2021 | Yun et al. |
| 2021/0125301 | A1 | 4/2021 | Park et al. |
| 2021/0126029 | A1 | 4/2021 | Roh et al. |
| 2021/0126032 | A1 | 4/2021 | Roh et al. |
| 2021/0126035 | A1 | 4/2021 | Roh et al. |
| 2021/0167110 | A1 | 6/2021 | Roh et al. |
| 2021/0249459 | A1 | 8/2021 | Yun et al. |

FOREIGN PATENT DOCUMENTS

| | | |
|---|---|---|
| KR | 101772968 B1 | 8/2017 |
| KR | 1020180055298 A | 5/2018 |
| KR | 10-2021-0048399 A | 5/2021 |
| KR | 10-2021-0048400 A | 5/2021 |
| KR | 10-2021-0048985 A | 5/2021 |
| KR | 10-2021-0048987 A | 5/2021 |
| KR | 10-2021-0049670 A | 5/2021 |
| KR | 10-2021-0066705 A | 6/2021 |
| KR | 10-2021-0102026 A | 8/2021 |

OTHER PUBLICATIONS

Chen, B.-H., et al., "GaN Metalens for Pixel-Level Full-Color Routing at Visible Light", NANO Letters, vol. 17, No. 10, .2017, pp. 6345-6352.

Nishiwaki, S., et al., "Efficient colour splitters for high-pixel-density image sensors", Nature Photonics, Feb. 3, 2013, vol. 7, pp. 240-246.

* cited by examiner

IMAGE SENSOR AND ELECTRONIC DEVICE INCLUDING THE SAME

CROSS-REFERENCE TO RELATED APPLICATION

This application claims priority to Korean Patent Application No. 10-2020-0016627, filed on Feb. 11, 2020, and Korean Patent Application No. 10-2020-0120027, filed on Sep. 17, 2020, in the Korean Intellectual Property Office, the disclosures of which are incorporated by reference herein in their entireties.

BACKGROUND

1. Field

Example embodiments consistent with the present disclosure relate to image sensors and electronic devices including the image sensors.

2. Description of Related Art

In general, image sensors use color filters to display images having various colors or detect the colors of incident light. However, color filters absorb all colors of light except for a corresponding color of each color filter, and thus, the optical efficiency of color filters may be low. For example, because RGB (red, green, and blue) color filters only transmit about ⅓ of incident light and absorb about ⅔ of the incident light, RGB color filters have an optical efficiency of only about 33% and result in large optical loss.

Recently, attempts to use color separation devices instead of color filters have been made to improve the optical efficiency of image sensors. Color separation devices are capable of separating the colors of incident light by using the diffraction or refraction of light which varies depending on the wavelength of light, and it is possible to adjust the directivity of light by using the refractive index and shape of color separation devices. Colors separated by color separation devices may be transmitted to corresponding pixels. However, the purity of colors separated by color separation devices of the related art is poor, and thus, improvements in color purity are needed.

SUMMARY

Example embodiments provide image sensors and electronic devices including the image sensors.

Additional aspects will be set forth in part in the description which follows and, in part, will be apparent from the description, or may be learned by practice of the presented embodiments of the disclosure.

According to an aspect of an example embodiment, there is provided an image sensor including: a light detector including a plurality of photosensitive cells configured to sense light; a color separation lens array provided above the light detector and including a plurality of pattern structures, the color separation lens array being configured to collect light having different wavelength spectra respectively on at least two photosensitive cells of the plurality of photosensitive cells; and a variable interlayer element configured to adjust an optical distance between the light detector and the color separation lens array.

The variable interlayer element may be further configured to adjust a physical distance between the light detector and the color separation lens array.

The variable interlayer element may include a microelectromechanical system actuator configured to drive a position of the color separation lens array.

The variable interlayer element may include: a variable shape structure including a variable shape material that is variable in shape according to an electrical signal applied thereto; and a signal application unit configured to apply the electrical signal to the variable shape structure.

The variable shape material may include a shape memory alloy or an electro-active polymer.

The variable interlayer element may include: a frame structure including a variable height region, provided with a stretchable membrane, and a reservoir region in which an optical fluid to be introduced into the variable height region is stored; and a signal application unit configured to apply a signal to move the optical fluid between the reservoir region and the variable height region for stretching or shrinking the stretchable membrane.

The variable interlayer element may include: a variable refractive index layer having a refractive index that is variable according to an electrical signal applied thereto; and a signal application unit configured to apply the electrical signal to the variable refractive index layer.

The variable refractive index layer may include $LiNbO_3$, $LiTaO_3$, potassium tantalate niobite (KTN), lead zirconate titanate (PZT), $VO_2$, $VO_2O_3$, EuO, MnO, CoO, $CoO_2$, $LiCoO_2$, $Ca_2RuO_4$, or liquid crystal.

The image sensor may further include a processor configured to: control the variable interlayer element to form a plurality of optical distances that are different from each other, and obtain image data by processing signals sensed by the light detector respectively at the plurality of optical distances.

The processor may be configured to perform computations on the image data by using spectrum data set according to the optical distances for the color separation lens array.

The color separation lens array may include a plurality of regions respectively facing the plurality of photosensitive cells of the light detector and including at least one pattern structure, and the plurality of regions may be configured to collect light having different wavelength spectra respectively on adjacent photosensitive cells of the plurality of photosensitive cells.

The plurality of regions may include a first region, a second region, a third region, and a fourth region which each include at least one of the plurality of pattern structures, and the plurality of photosensitive cells may include first photosensitive cell, second photosensitive cell, third photosensitive cell, and fourth photosensitive cell which face the first region, the second region, the third region, and the fourth region, respectively.

The image sensor may have a pixel arrangement structure in which a plurality of unit pixels are arranged in a Bayer pattern according to the optical distance and the plurality of unit pixels include red, green, and blue pixels.

Shapes, arrangements, and sizes of pattern structures respectively provided in the first region, the second region, the third region, and the fourth region may be determined such that immediately after passing through the color separation lens array, light having a first wavelength has a phase difference of $2N\pi$ at positions corresponding to a center portion of the first photosensitive cell and a center portion of the fourth photosensitive cell and a phase difference of $(2N-1)\pi$ at positions corresponding to center portion of the second photosensitive cell and a center portion of the third photosensitive cell, where N is an integer greater than 0.

Shapes, arrangements, and sizes of pattern structures respectively provided in the first region, the second region, the third region, and the fourth region may be determined such that immediately after passing through the color separation lens array, light having a second wavelength has a phase difference of $2M\pi$ at a position corresponding to a center portion of the second photosensitive cell, a phase difference of $(2M-1)\pi$ at positions corresponding to a center portion of the first photosensitive cell and a center portion of the fourth photosensitive cell, and a phase difference of greater than $(2M-2)\pi$ and less than $(2M-1)\pi$ at a position corresponding to a center portion of the third photosensitive cell, where M is an integer greater than 0.

Shapes, arrangements, and sizes of pattern structures respectively provided in the first region, the second region, the third region, and the fourth region may be determined such that immediately after passing through the color separation lens array, light having a third wavelength has a phase difference of $2L\pi$ at a position corresponding to a center portion of the third photosensitive cell, a phase difference of $(2L-1)\pi$ at positions corresponding to a center portions of the first photosensitive cell and a center portion of the fourth photosensitive cell, and a phase difference of greater than $(2L-2)\pi$ and less than $(2L-1)\pi$ at a position corresponding to a center portion of the second photosensitive cell, where L is an integer greater than 0.

The plurality of pattern structures may include a plurality of nano-posts, and nano-posts provided in the first region, nano-posts provided in the second region, nano-posts provided in the third region, and nano-posts provided in the fourth region may be different from each other in at least one of shape, size, and arrangement.

Nano-posts, which are provided in regions corresponding to green pixel among the first region, the second region, the third region, and the fourth region, may be arranged according to distribution rules that are different in a first direction and a second direction perpendicular to the first direction.

Nano-posts, which are provided in regions corresponding to blue and red pixels among the first region, the second region, the third region, and the fourth region, may be arranged according to symmetrical distribution rules in the first direction and the second direction.

The plurality of pattern structures may include a first pattern structure, a second pattern structure, a third pattern structure, and a fourth pattern structure formed in the first region, the second region, the third region, and the fourth region, respectively.

The first pattern structure may include a first dielectric having a first refractive index and provided in a first form, and a second dielectric having a second refractive index less than the first refractive index and filled in gaps of the first dielectric provided in the first form, and the first dielectric may be present in any vertical cross-section of the first pattern structure.

The first region and the fourth region may correspond to green pixel, the second region corresponds to blue pixel, and the third region corresponds to red pixel, and the first pattern structure and the fourth pattern structure may have a 2-fold symmetrical form, the second pattern structure and the third pattern structure may have a 4-fold symmetrical form, and the fourth pattern structure may have a form rotated 90 degrees with respect to the first pattern structure.

According to an aspect of an example embodiment, there is provided an photographing device including: an imaging unit configured to form an optical image by condensing light reflected from an object; and an image sensor configured to convert the optical image formed by the imaging unit into an electrical signal, wherein the image sensor includes: a light detector including a plurality of photosensitive cells configured to sense light; a color separation lens array provided above the light detector and including a plurality of pattern structures, the color separation lens array being configured to collect light having different wavelength spectra respectively on at least two photosensitive cells of the plurality of photosensitive cells; and a variable interlayer element configured to adjust an optical distance between the light detector and the color separation lens array.

According to an aspect of an example embodiment, there is provided an electronic device including a photographing device, the photographing device including: an imaging unit configured to form an optical image by condensing light reflected from an object; and an image sensor configured to convert the optical image formed by the imaging unit into an electrical signal, wherein the image sensor includes: a light detector including a plurality of photosensitive cells configured to sense light; a color separation lens array provided above the light detector and including a plurality of pattern structures, the color separation lens array being configured to collect light having different wavelength spectra respectively on at least two photosensitive cells of the plurality of photosensitive cells; and a variable interlayer element configured to adjust an optical distance between the light detector and the color separation lens array.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
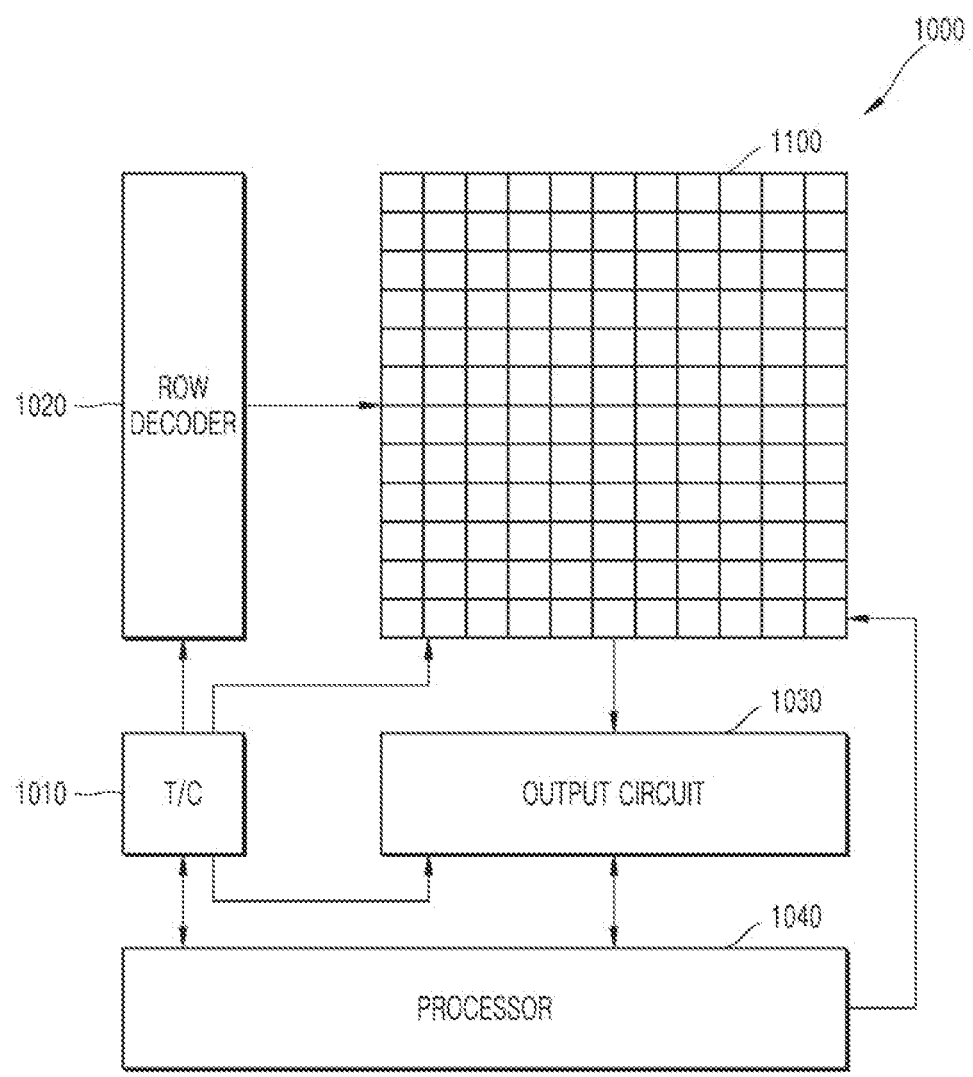
FIG. 1 is a block diagram illustrating an image sensor according to an example embodiment.

Hereinafter, embodiments will be described with reference to the accompanying drawings. The embodiments described herein are for illustrative purposes only, and various modifications may be made therein. In this regard, the present example embodiments may have different forms and should not be construed as being limited to the descriptions set forth herein. Accordingly, the example embodiments are merely described below, by referring to the figures, to explain aspects.

As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In the drawings, like reference numerals refer to like elements, and the sizes of elements may be exaggerated for clarity of illustration.

In the following description, when an element is referred to as being "above" or "on" another element, it may be directly on the other element while making contact with the other element or may be above the other element without making contact with the other element.

Although the terms "first" and "second" are used to describe various elements, these terms are only used to distinguish one element from another element. These terms do not limit elements to having different materials or structures.

The terms of a singular form may include plural forms unless otherwise mentioned. It will be further understood that the terms "comprises" and/or "comprising" used herein specify the presence of stated features or elements, but do not preclude the presence or addition of one or more other features or elements.

In the present disclosure, terms such as "unit" or "module" may be used to denote a unit that has at least one function or operation and is implemented with hardware, software, or a combination of hardware and software.

An element referred to with the definite article or a demonstrative pronoun may be construed as the element or the elements even though it has a singular form.

Operations of a method may be performed in appropriate order unless explicitly described in terms of order or described to the contrary. In addition, examples or exemplary terms (for example, "such as" and "etc.") are used for the purpose of description and are not intended to limit the scope of the disclosure unless defined by the claims.

Figure 2:
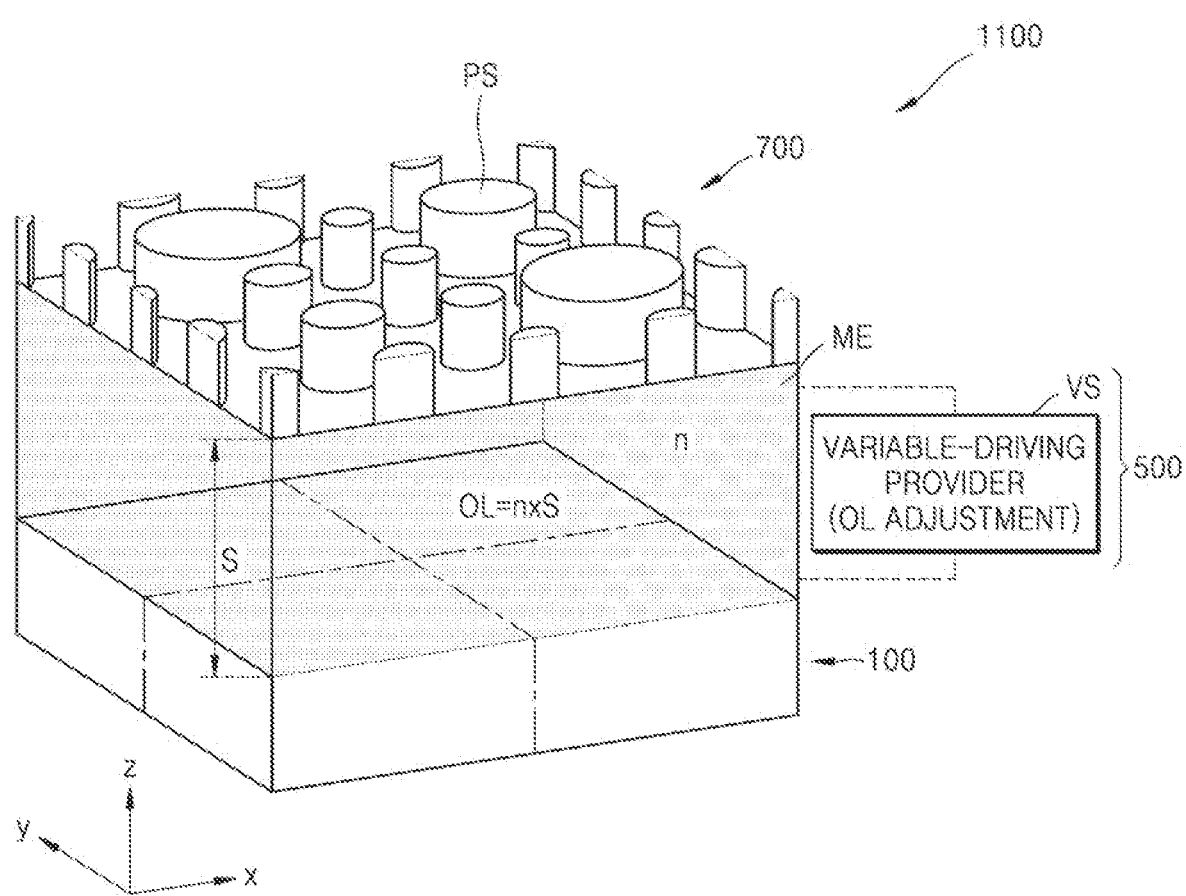
FIG. 2 is a conceptual view schematically illustrating a pixel array configuration of an image sensor according to an example embodiment.

FIG. 1 is a block diagram schematically illustrating an image sensor 1000 according to an example embodiment, and FIG. 2 is a conceptual view illustrating a pixel array configuration of the image sensor 1000 according to an example embodiment.

Referring to FIG. 1, according to an example embodiment, the image sensor 1000 may include an pixel array 1100, a timing controller (T/C) 1010, a row decoder 1020, an output circuit 1030, and a processor 1040 which is configured to control the pixel array 1100, the timing controller 1010, and the output circuit 1030, and process image signals output through the output circuit 1030. The image sensor 1000 of the example embodiment may include a charge coupled device (CCD) image sensor or a complementary metal oxide semiconductor (CMOS) image sensor.

The pixel array 1100 includes a plurality of pixels which are two-dimensionally arranged in a plurality of rows and a plurality of columns. The row decoder 1020 selects one of the rows of the pixel array 1100 in response to a row address signal which is output from the timing controller 1010. The output circuit 1030 outputs, on a column basis, light detection signals received from a plurality of pixels arranged in the selected row. To this end, the output circuit 1030 may include a column decoder and an analog-to-digital converter (ADC). For example, the output circuit 1030 may include a plurality of ADCs which are arranged between the column decoder and the pixel array 1100 respectively for the columns. Alternatively, the output circuit 1030 may include an ADC which is arranged at an output end of the column decoder. According to example embodiments, the timing controller 1010, the row decoder 1020, the output circuit 1030, and the processor 1040 may be implemented as a single chip, or may be implemented as separate chips.

As shown in FIG. 2, the pixel array 1100 includes a light detector 100 including a plurality of photosensitive cells for sensing light, a color separation lens array 700 arranged above the light detector 100 and including a plurality of pattern structures PS, and a variable interlayer element 500 configured to adjust an optical distance OL between the light detector 100 and the color separation lens array 700.

The color separation lens array 700 is configured to split incident light such that light having different wavelength spectra may be incident on at least two different cells of the light detector 100. For this, factors such as the sizes, positions, or arrangement of the pattern structures PS of the color separation lens array 700 may be set. The color separation lens array 700 may include a plurality of regions respectively facing the photosensitive cells of the light detector 100, and immediately after incident light passes through the color separation lens array 700, the light may have a predetermined phase distribution according to the arrangement of the regions and the pattern structures PS of the color separation lens array 700.

When the light having the predetermined phase distribution is incident on the light detector 100 after proceeding a predetermined distance from the color separation lens array 700, the wavelength spectrum of the light incident on the photosensitive cells of the light detector 100 is determined according to the predetermined distance. The predetermined distance is an optical length OL, which is determined by the refractive index (n) of a medium ME between the color separation lens array 700 and the light detector 100 and the physical distance S between the color separation lens array 700 and the light detector 100, as OL=n*S.

According to an example embodiment, the pixel array 1100 of the image sensor 1000 includes the variable interlayer element 500 configured to vary the optical distance OL. The variable interlayer element 500 includes the medium ME and a variable driving provider VS configured to variably drive the medium ME. The variable driving provider VS may include a structure and/or a variable signal application unit which are connected in various forms to the medium ME to adjust the optical distance OL. The variable driving provider VS may be controlled by the processor 1040. For example, the processor 1040 may control the variable interlayer element 500 to form a predetermined optical distance OL, or a plurality of optical distances OL which are different from each other. The optical distance OL or optical distances OL which are set as described above may be used when the processor 1040 processes signals output from the optical detection unit 100. This will be described with reference to FIGS. 5 to 7. The variable interlayer element 500 may vary the physical distance S between the light detector 100 and the color separation lens array 700, or the refractive index of the medium ME between the light detector 100 and the color separation lens array 700. In the medium ME and the structure connected in various forms to the medium ME, elements positioned between the color separation lens array 700 and the light detector 100 may include a light-transmitting material. The light detector 100 may be positioned at a plurality of positions depending on the optical distance OL determined by the variable interlayer element 500, and optical information may be obtained at the positions based on different spectra.

Each element of the pixel array 1100 will now be described.

Figure 3A:
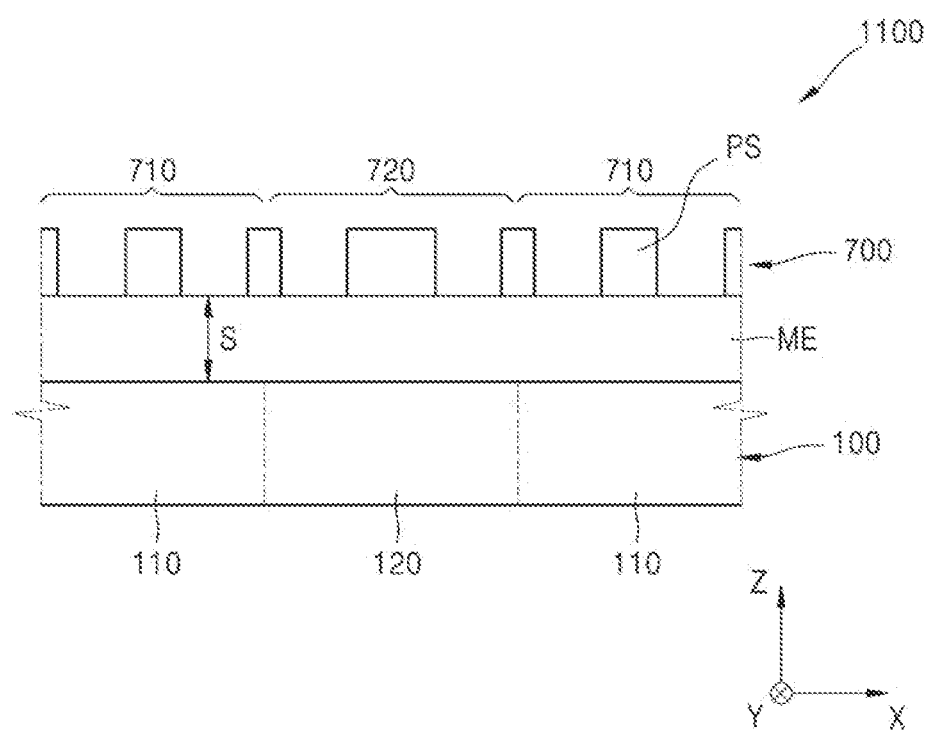
FIGS. 3A and 3B are different cross-sectional views schematically illustrating the pixel array configuration of the image sensor of example embodiments.
Figure 3B:
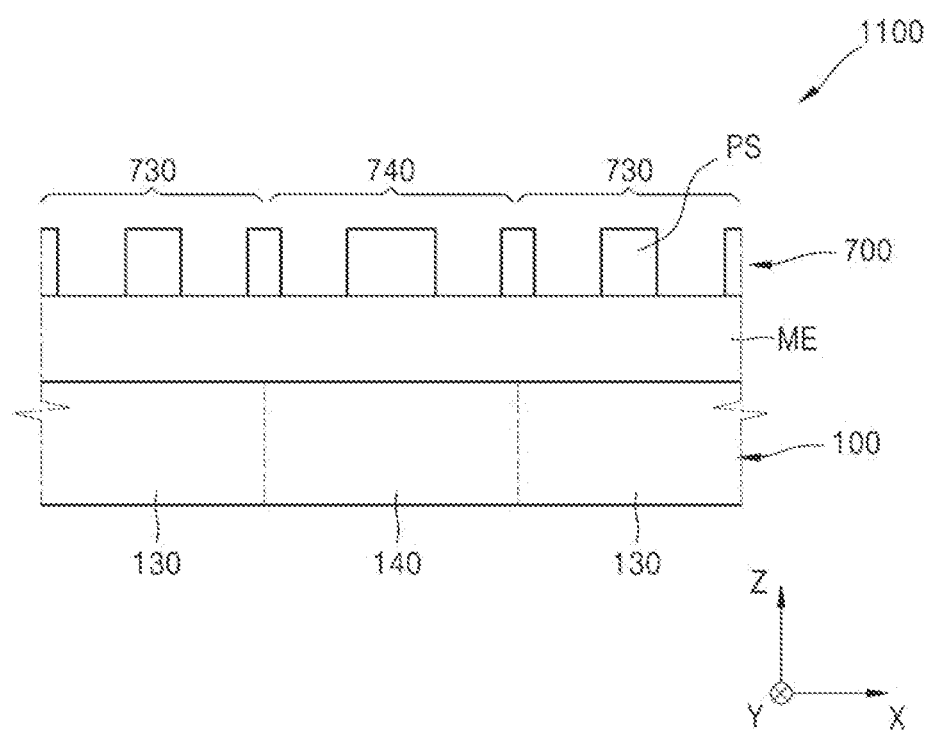
Figure 4A:
FIGS. 4A and 4B are example plan views illustrating an arrangement of pixels of the image sensor and an arrangement of photosensitive cells of the image sensor which correspond to pixel regions according to example embodiments.
Figure 4B:
Figure 4C:
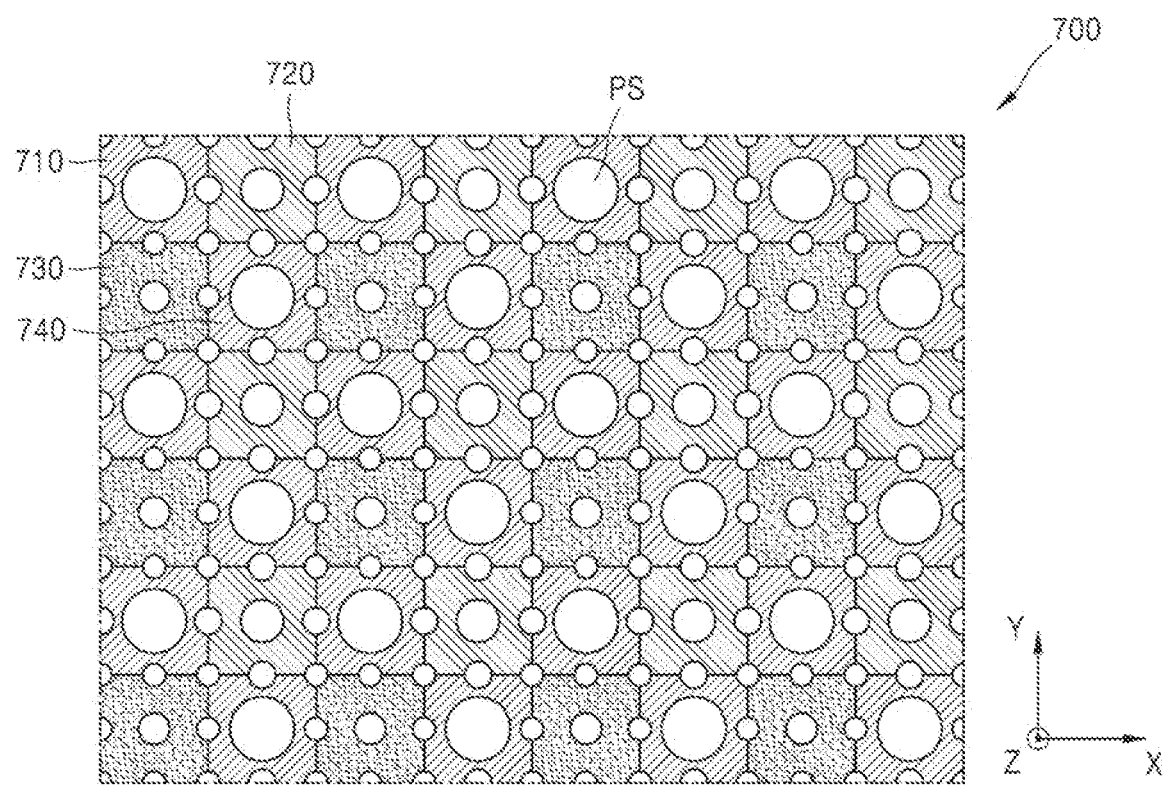
FIGS. 4C and 4D are an example plan view illustrating fine structures arranged in a plurality of regions of a color separation lens array according to an example embodiment, and an enlarged plan view illustrating a region of FIG. 4C.
Figure 4D:
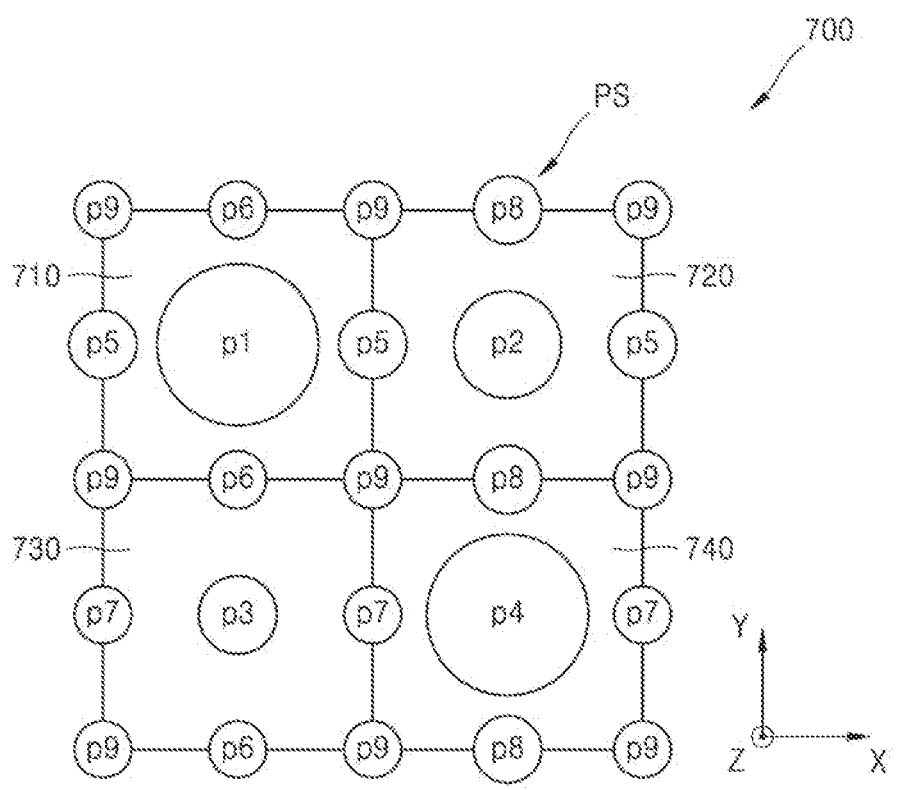

FIGS. 3A and 3B are different cross-sectional views schematically illustrating the pixel array 1100 of the image sensor 1000 according to example embodiments, and FIGS. 4A and 4B are plan views illustrating an arrangement of pixels of the image sensor 1000 and an arrangement of photosensitive cells of the image sensor 1000 which correspond to pixel regions according to example embodiments. FIG. 4C is an example plan view illustrating a plurality of pattern structures PS arranged in a plurality of regions of the color separation lens array 700 according to an example embodiment, and FIG. 4D is an enlarged plan view illustrating a region of FIG. 4C. The pixel array 1100 includes the light detector 100 including the photosensitive cells such as first photosensitive cells 110, second photosensitive cells 120, third photosensitive cells 130, and fourth photosensitive cells 140 which are configured to sense light; and the color separation lens array 700 arranged above the light detector 100 at a distance from the light detector 100.

The light detector 100 may include the first photosensitive cells 110, the second photosensitive cells 120, the third photosensitive cells 130, and the fourth photosensitive cells 140 that are configured to convert light into electrical signals. The first photosensitive cells 110, the second photosensitive cells 120, the third photosensitive cells 130, and the fourth photosensitive cells 140 may be alternately arranged. As shown in the cross-sectional view of FIG. 3A, the first photosensitive cells 110 and the second photosensitive cells 120 may be alternately arranged in a first direction (X direction), and as shown in another cross-sectional view of FIG. 3B taken at a different position in a Y direction, the third photosensitive cells 130 and the fourth photosensitive cells 140 may be alternately arranged. This cell arrangement is for sensing incident light on a pixel basis, and for example, the first photosensitive cells 110 and the fourth photosensitive cells 140 may sense light having a first spectrum corresponding to first pixels P1, the second photosensitive cells 120 may sense light having a second spectrum corresponding to second pixels P2, and the third photosensitive cells 130 may sense light having a third spectrum corresponding to third pixels P3. Light having the first spectrum may be green light, light having the second spectrum may be blue light, and light having the third spectrum may be red light. However, this is a non-limiting example. In an example embodiment, because the optical distance OL between the light detector 100 and the color separation lens array 700 of the image sensor 1000 is variable, the first spectrum, the second spectrum, and the third spectrum may have different ratios of green light, red light, and blue light, and the ratios may vary depending on the optical distance OL. A separation film may be further formed at cell boundaries to separate cells.

The color separation lens array 700 includes the pattern structures PS, which are arranged according to a predetermined rule. Here, the rule is applied to parameters such as the shapes, sizes (width, height), spacing, and arrangement of the pattern structures PS, and the parameters may be determined depending on a target phase distribution for light incident on the color separation lens array 700. The target phase distribution refers to a phase distribution that incident light has at a position immediately after passing through the color separation lens array 700.

The pattern structures PS may include at least one selected from the group consisting of c-Si, p-Si, a-Si, a Group III-V compound semiconductor (GaP, GaN, GaAs, or the like), SiC, $TiO_2$, and SiN.

The pattern structures PS may have a sub-wavelength shape dimension. The term "sub-wavelength" refers to a value less than the wavelength of incident light that is to have an intended phase distribution. At least one of the dimensions defining the shapes of the pattern structures PS may be a sub-wavelength dimension.

The pattern structures PS may be supported by a material of the medium ME arranged between the pattern structures PS and the light detector 100. However, this is merely an example. In another example, the material of the medium ME may be air, and an additional support layer may be provided. In this case, the support layer may include any one selected from the group consisting of glass (fused silica, BK7, or the like), quartz, polymers (PMMA, SU-8, or the like), and plastics. The material of the medium ME or the support layer may have a refractive index lower than the refractive index of a material of the pattern structures PS. In addition, a protective layer for protecting the pattern structures PS may be further provided. The protective layer may include a dielectric material having a refractive index lower than the refractive index of the material of the pattern structures PS.

The pattern structures PS having a refractive index different from the refractive index of surrounding materials may change the phase of light passing through the pattern structures PS. This is due to a phase delay caused by the sub-wavelength shape dimension of the pattern structures PS, and the amount of phase delay is determined by factors such as the shape dimensions and arrangement of the pattern structures PS. The amount of phase delay occurring at each of the pattern structures PS of the color separation lens array 700 may be set such that incident light may have an intended phase distribution.

The pattern structures PS may be shaped, sized, and arranged to form a phase distribution for collecting light of different spectra onto the first photosensitive cells 110 and the second photosensitive cells 120 that are adjacent to each other. In addition, the pattern structures PS may be shaped, sized, and arranged to form a phase distribution for collecting light of different spectra onto the third photosensitive cells 130 and the fourth photosensitive cells 140 that are adjacent to each other.

The color separation lens array 700 is divided into a plurality of regions such as first regions 710, second regions 720, third regions 730, and fourth regions 740, which correspond to the first, second, third, and fourth photosensitive cells 110, 120, 130, and 140 in a one-to-one manner. At least one pattern structure PS may be arranged in each of the first, second, third, and fourth regions 710, 720, 730, and 740, and at least one of the shapes, sizes, and arrangement of the pattern structures PS may vary depending on the first, second, third, and fourth regions 710, 720, 730, and 740.

As shown in FIGS. 3A and 3B, the color separation lens array 700 may be divided into regions such that the first regions 710 and the first photosensitive cells 110 may correspond to each other, the second regions 720 and the second photosensitive cells 120 may correspond to each other, the third regions 730 and the third photosensitive cells 130 may correspond to each other, and the fourth regions 740 and the fourth photosensitive cells 140 may correspond to each other. The color separation lens array 700 includes a plurality of unit pattern arrays which are two-dimensionally arranged, and each of the unit pattern arrays includes four regions arranged in 2×2 form: that is, the first regions 710, the second region 720, the third region 730, and the fourth region 740.

FIGS. 3A and 3B illustrate that the first, second, third, and fourth regions 710, 720, 730, and 740, and the first, second, third, and fourth photosensitive cells 110, 120, 130, and 140 have the same size and face each other in a vertical direction, but this is a non-limiting example. A plurality of regions defined in a different form may correspond to a plurality of photosensitive cells. This also applies to other example embodiments described below.

The color separation lens array 700 may be divided into regions to split light and collect the split light on the first, second, third, and fourth photosensitive cells 110, 120, 130, and 140 in such a manner that light having the first spectrum is collected on the first photosensitive cells 110 and the fourth photosensitive cells 140, light having the second spectrum is collected on the second photosensitive cells 120, and light having the third spectrum is collected on the third photosensitive cells 130, and the sizes, shapes, and arrangement of the pattern structures PS may be determined according to the regions of the color separation lens array 700. As illustrated in FIG. 4A, the arrangement of pixels in the pixel array 1100 may be similar to a Bayer pattern. Each unit pixel includes four quadrant regions to which two first pixels P1, one second pixel P2, and one third pixel P3 are allocated. The unit pixels are repeatedly two-dimensionally arranged in the first direction (X direction) and a second direction (Y direction). Two first pixels P1 are arranged in a diagonal direction in each unit pixel having a 2×2 array form, and one second pixel P2 and one third pixel P3 are arranged in the other diagonal direction in the unit pixel. As a whole, first and second rows are repeatedly arranged, wherein a plurality of first pixels P1 and a plurality of second pixels P2 are alternately arranged in the first direction in each of the first rows, and a plurality of third pixels P3 and a plurality of first pixels P1 are alternately arranged in the first direction in each of the second rows. The colors of the first pixels P1, the second pixels P2, and the third pixels P3 are not fixed, but may be varied depending on the optical distance OL between the light detector 100 and the color separation lens array 700. The colors or wavelength distributions of the first pixels P1, the second pixels P2, and the third pixels P3 may be expressed by the first spectrum, the second spectrum, and the third spectrum, respectively. In addition, specific wavelength distribution forms of the first spectrum, the second spectrum, and the third spectrum may vary depending on the optical distance OL.

Referring to FIG. 4B, the first photosensitive cells 110, the second photosensitive cells 120, the third photosensitive cells 130, and the fourth photosensitive cells 140 are two-dimensionally arranged in the first direction (X direction) and the second direction (Y direction) such that rows, in which the first photosensitive cells 110 and the second photosensitive cells 120 are alternately arranged, and rows, in which the third photosensitive cells 130 and the fourth photosensitive cells 140 are alternately arranged, may be alternately repeated. Therefore, the first photosensitive cells 110 or the fourth photosensitive cells 140 correspond to the first pixels P1, the second photosensitive cells 120 correspond to the second pixels P2, and the third photosensitive cells 130 correspond to the third pixels P3.

Referring to FIGS. 4B and 4C, the first photosensitive cells 110 and the first regions 710 may correspond to some of the first pixels P1, the fourth photosensitive cells 140 and the fourth regions 740 may correspond to the rest of the first pixels P1, the second photosensitive cells 120 and the second regions 720 may correspond to the second pixels P2, and the third photosensitive cells 130 and the third regions 730 may correspond to the third pixels P3.

As illustrated in FIG. 4C, pattern structures PS having different cross-sectional areas may be arranged on center portions of the first pixels P1, the second pixels P2, and the third pixels P3, and pattern structures PS may be arranged on centers and intersections of boundaries between the first pixels P1, the second pixels P2, and the third pixels P3. The cross-sectional areas of the pattern structures PS arranged on the boundaries of the first pixels P1, the second pixels P2, and the third pixels P3 may be less than the cross-sectional areas of the pattern structures PS arranged on the center portions of the first pixels P1, the second pixels P2, and the third pixels P3.

FIG. 4D illustrates a region of FIG. 4C, that is, an arrangement of pattern structures PS in first, second, third, and fourth regions 710, 720, 730, and 740 which form a unit pattern array. In FIG. 4D, the pattern structures PS are denoted with p1 to p9 according to the positions of the pattern structures PS in the unit pattern array. Referring to FIG. 4D illustrating the pattern structures PS, the cross-sectional area of a pattern structure p1 arranged in a center portion of the first region 710 and the cross-sectional area of a pattern structure p4 arranged in a center portion of the fourth region 740 are greater than the cross-sectional area of a pattern structure p2 arranged on a center portion of the second region 720 and the cross-sectional area of a pattern structure p3 arranged in a center portion of the third region 730, and the cross-sectional area of a pattern structure p2 arranged in a center portion of the second region 720 is greater than the cross-sectional area of a pattern structure p3 arranged in a center portion of the third region 730. However, this is only an example, and the pattern structures PS may be variously shaped, sized, and arranged. Here, the cross-sectional area of each pattern structure PS refers to the area of a cross-section of the pattern structure PS perpendicular to the height direction (Z direction) of the pattern structure PS.

The pattern structures PS provided in the first and fourth regions 710 and 740 corresponding to the first pixels P1 may be distributed according to different distribution rules in the first direction (X direction) and the second direction (Y direction). For example, the pattern structures PS provided in the first and fourth regions 710 and 740 corresponding to the first pixels P1 may be arranged with different sizes in the first direction (X direction) and the second direction (Y direction). Referring to FIG. 4D illustrating the pattern structures PS, the cross-sectional area of a pattern structure p5 positioned at the boundary of the first region 710 adjacent to the second region 720 in the first direction (X direction) is different from the cross-sectional area of a pattern structure p6 positioned at the boundary of the first region 710 adjacent to the third region 730 in the second direction (Y direction). Similarly, the cross-sectional area of a pattern structure p7 positioned at the boundary of the fourth region 740 adjacent to the third region 730 in the first direction (X direction) is different from the cross-sectional area of a pattern structure p8 positioned at the boundary of the fourth region 730 adjacent to the second region 720 in the second direction (Y direction).

The pattern structures PS provided in the second region 720 corresponding to the second pixel P2 and the third region 730 corresponding to the third pixel P3 may be arranged according to symmetrical distribution rules in the first direction (X direction) and the second direction (Y direction). As shown in FIG. 4D, among the pattern structures PS, the cross-sectional area of pattern structures p5 arranged at the boundaries between the second region 720 and regions adjacent to the second region 720 in the first direction (X direction) is equal to the cross-sectional area of pattern structures p8 arranged at the boundaries between the second region 720 and regions adjacent to the second region 720 in the second direction (Y direction), and the cross-sectional area of pattern structures p7 arranged at the boundaries between the third region 730 and regions adjacent to the third region 730 in the first direction (X direction) is equal to the cross-sectional area of pattern structures p6 arranged at the boundaries between the third region 730 and regions adjacent to the third region 730 in the second direction (Y direction).

In addition, pattern structures p9, which are arranged at four corners of each of the first, second, third, and fourth regions 710, 720, 730, and 740, that is, at each position at which four regions meet each other, have the same cross-sectional area.

This distribution is due to the arrangement of pixels similar to the Bayer pattern. Both the second pixel P2 and the third pixel P3 have the first pixels P1 as pixels adjacent thereto in the first direction (X direction) and the second direction (Y direction), whereas the first pixel P1 corresponding to the first region 710 has different pixels as pixels adjacent thereto: the second pixel P2 in the first direction (X direction) and the third pixel P3 in the second direction (Y direction), and the first pixel P1 corresponding to the fourth region 740 has different pixels as pixels adjacent thereto: the third pixel P3 in the first direction (X direction) and the second pixel P2 in the second direction (Y direction). In addition, each of the first pixels P1 corresponding to the first region 710 and the fourth region 740 has first pixels P1 as pixels adjacent thereto in four diagonal directions, the second pixel P2 corresponding to the second region 720 has third pixels P3 as pixels adjacent thereto in four diagonal directions, and the third pixel P3 corresponding to the third region 730 has second pixels P2 as pixels adjacent thereto in four diagonal directions. Therefore, pattern structures PS may be arranged in 4-fold symmetry in the second region 720 and the third region 730 which respectively correspond to the second pixel P2 and the third pixel P3, and pattern structures PS may be arranged with 2-fold symmetry in the first and fourth regions 710 and 740 which correspond to the first pixels P1. In particular, the first region 710 and the fourth region 740 are rotated 90 degrees with respect to each other.

The pattern structures PS are all illustrated as having a symmetrical circular cross-sectional shape, but are not limited thereto. Some of the pattern structures may have an asymmetrical cross-sectional shape. For example, pattern structures PS having an asymmetrical cross-sectional shape with different widths in the first direction (X direction) and the second direction (Y direction) may be arranged in the first region 710 and the fourth region 740 corresponding to the first pixels P1, and pattern structures PS having a symmetrical cross-sectional shape with the same width in the first direction (X direction) and the second direction (Y direction) may be arranged in the second regions 720 and the third regions 730 respectively corresponding to the second pixels P2 and the third pixels P3.

The arrangement rules of the color separation lens array 700 are an example in which, immediately after passing through the color separation lens array 700, light has a target phase distribution for being split and collected in such a manner that light having a first spectrum is collected on the first and fourth photosensitive cells 110 and 140, light having a second spectrum is collected on the second photosensitive cells 120, and light having a third spectrum is collected on the third photosensitive cells 130. However, the arrangement rules of the color separation lens array 700 are not limited to the illustrated patterns.

The shapes, sizes, and arrangement of the pattern structures PS provided in each region of the color separation lens array 700 may be determined such that after passing through the color separation lens array 700, light having the first spectrum may have a phase distribution for being collected on the first and fourth photosensitive cells 110 and 140 while not proceeding to the second and third photosensitive cells 120 and 130 adjacent to the first and fourth photosensitive cells 110 and 140.

Likewise, the shapes, sizes, and arrangement of the pattern structures PS provided in each region of the color separation lens array 700 may be determined such that after passing through the color separation lens array 700, light having the second spectrum may have a phase distribution for being collected on the second photosensitive cells 120 while not proceeding to the first, third, and fourth photosensitive cells 110, 130, and 140 adjacent to the second photosensitive cells 120.

Likewise, the shapes, sizes, and arrangement of the pattern structures PS provided in each region of the color separation lens array 700 may be determined such that after passing through the color separation lens array 700, light having the third spectrum may have a phase distribution for being collected on the third photosensitive cells 120 while not proceeding to the first, second, and fourth photosensitive cells 110, 120, and 140 adjacent to the third photosensitive cells 130.

According to example embodiments, the pixel array 1100 of the image sensor 1000 may have a variable optical distance between the light detection unit 100 and the color separation lens array 700, and thus, wavelength-dependent light separation according to the shapes, sizes, and arrangement of the pattern structures PS is described by assuming a particular optical distance.

The shapes, sizes, and/or arrangement of the pattern structures PS may be determined to satisfy all of such conditions, and light may have the following target phase distribution immediately after passing through the color separation lens array 700. At a position immediately after the color separation lens array 700, that is, on the lower surface of the color separation lens array 700 or the upper surface of the variable interlayer element 500, light having a first wavelength may have a phase difference of $2N\pi$ in center portions of the first regions 710 corresponding to the first photosensitive cells 110 and in center portions of the fourth regions 740 corresponding to the fourth photosensitive cells 140, and a phase difference of $(2N-1)\pi$ in center portions of the second regions 720 corresponding to the second photosensitive cells 120 and in center portions of the third regions 730 corresponding to the third photosensitive cells 130. Here, N is an integer greater than 0. In other words, at a position immediately after the color separation lens array 700, light having a first wavelength may have a phase distribution which peaks in center portions of the first regions 710 and center portions of the fourth regions 740 and gradually decreases therefrom in a concentric circle shape to have valleys in center portions of the second regions 720 and center portions of the third regions 730. For example, when N=1, at a position after the color separation lens array 700, the phase of light having a first wavelength may be $2\pi$ in the center portions of the first regions 710 and center portions of the fourth regions 740 and $\pi$ in the center portions of the second regions 720 and the center portions of the third regions 730. Here, the phase of light may refer to a phase relative to the phase of the light before passing through the color separation lens array 700.

In addition, at a position immediately after the color separation lens array 700, the phase of light having a second wavelength may be $2M\pi$ in the center portions of the second regions 720 corresponding to the second photosensitive cells 120, $(2M-1)\pi$ in the center portions of the first regions 710 corresponding to the first photosensitive cells 110 and in the center portions of the fourth regions 740 corresponding to the fourth photosensitive cells 140, and a value greater than $(2M-2)\pi$ but less than $(2M-1)\pi$ in the center portions of the third regions 730 corresponding to the third photosensitive cells 130. Here, M is an integer greater than 0. In other words, at a position immediately after the color separation lens array 700, light having the second wavelength may have a phase distribution which peaks in the center portions of the second regions 720 and gradually decreases therefrom in a concentric circle shape to have local minimums in the center portions of the first, fourth, and third regions 710, 740, and 730. For example, when M=1, at a position after the color separation lens array 700, the phase of light having the second wavelength may be $2\pi$ in the center portions of the second regions 720 and $\pi$ in the center portions of the first regions 710 and the center portions of the fourth regions 740, and a value of about $0.2\pi$ to about $0.7\pi$ in the center portions of the third regions 730.

In addition, similarly, at a position immediately after the color separation lens array 700, the phase of light having a third wavelength may be $2L\pi$ in the center portions of the third regions 730 corresponding to the third photosensitive cells 130, $(2L-1)\pi$ in the center portions of the first regions 710 corresponding to the first photosensitive cells 110 and in the center portions of the fourth regions 740 corresponding to the fourth photosensitive cells 140, and a value greater than $(2L-2)\pi$ but less than $(2L-1)\pi$ in the center portions of the second regions 720 corresponding to the second photosensitive cells 120. Here, L is an integer greater than 0. In other words, at a position immediately after the color separation lens array 700, light having the third wavelength may have a phase distribution which peaks in the center portions of the third regions 730 and gradually decreases therefrom in a concentric circle shape to have local minimums in the center portions of the first, fourth, and second regions 710, 740, and 720. For example, when L=1, at a position after the color separation lens array 700, the phase of light having the third wavelength may be $2\pi$ in the center portions of the third regions 730 and $\pi$ in the center portions of the first regions 710 and the center portions of the fourth regions 740, and a value of about 0.2? to about 0.7? in the center portions of the second regions 720.

Light having the first wavelength, light having the second wavelength, and light having the third wavelength may be green light, blue light, and red light, respectively. However, this is a non-limiting example.

As described above, the target phase distribution refers to a phase distribution at a position immediately after the color separation lens array 700, and when light having the target phase distribution proceeds toward the first, second, third, and fourth photosensitive cells 110, 120, 130, and 140, the light may have different spectra depending on the distance the light has traveled. That is, light having different spectra may be collected on the first, second, third, and fourth photosensitive cells 110, 120, 130, and 140 by adjusting the optical distance OL to the light detector 100.

Figure 5:
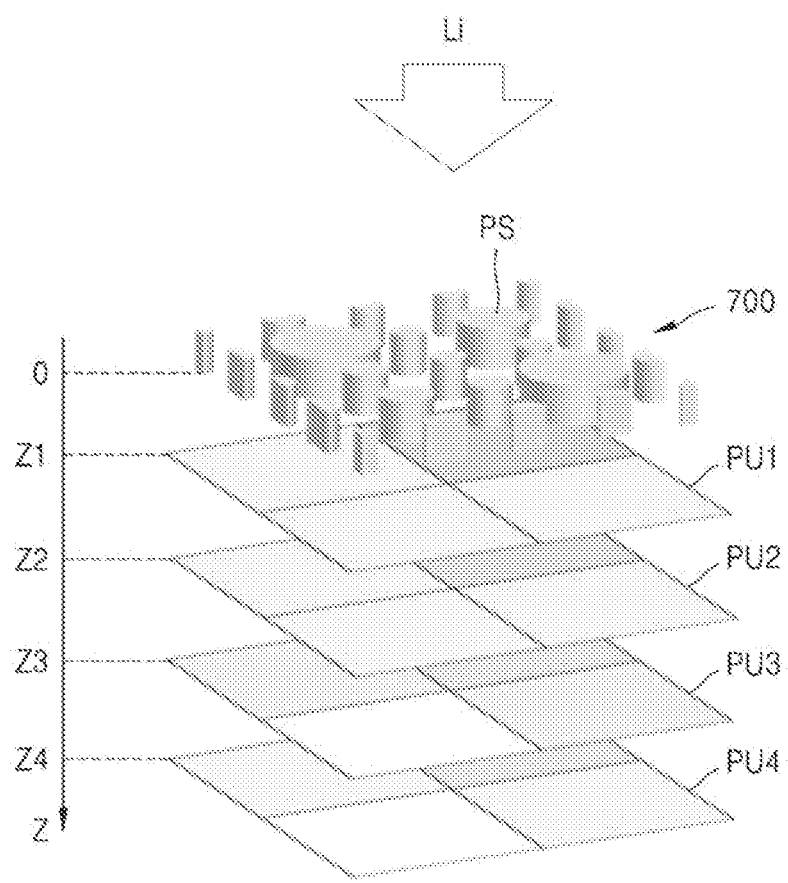
FIG. 5 is a conceptual view illustrating that incident light has different spectra according to the distance from the color separation lens array in the image sensor according to an example embodiment.
Figure 6A:
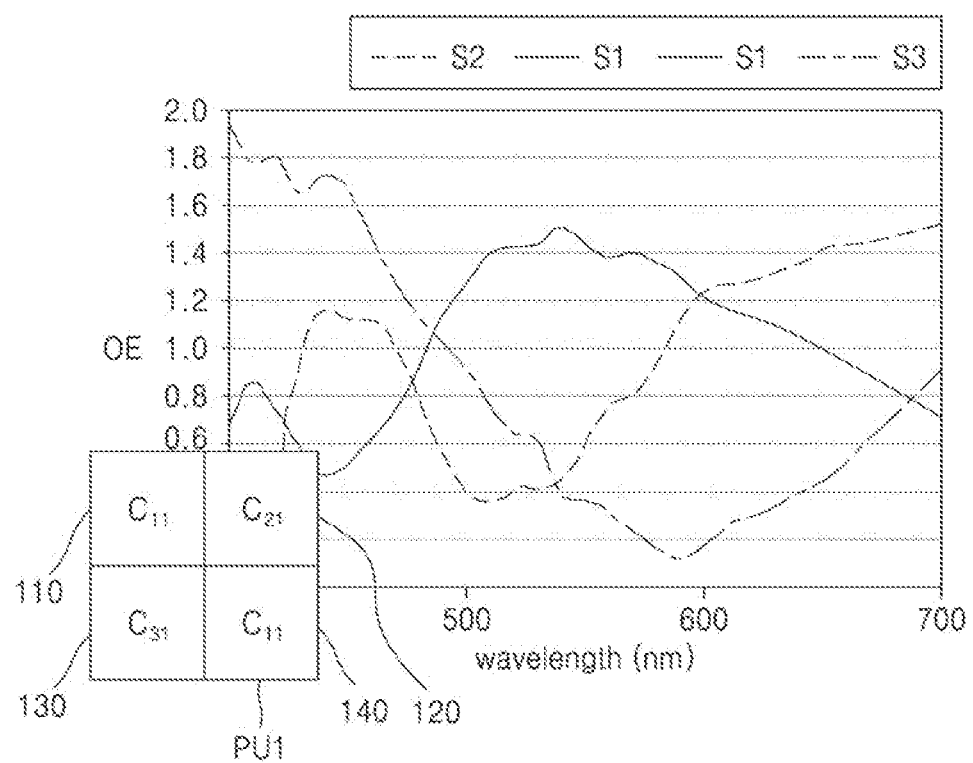
FIGS. 6A to 6D are graphs illustrating spectra of light which are separately incident on a plurality of photosensitive cells for different optical distances between the color separation lens array and a light detector in the image sensor according to example embodiments.
Figure 6B:
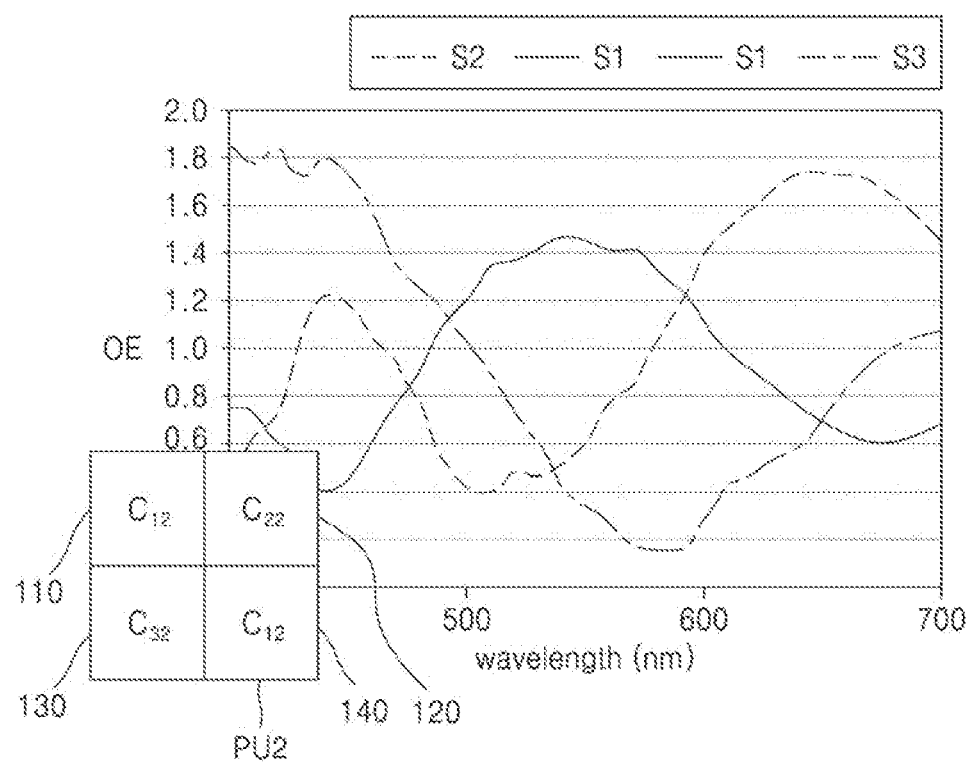
Figure 6C:
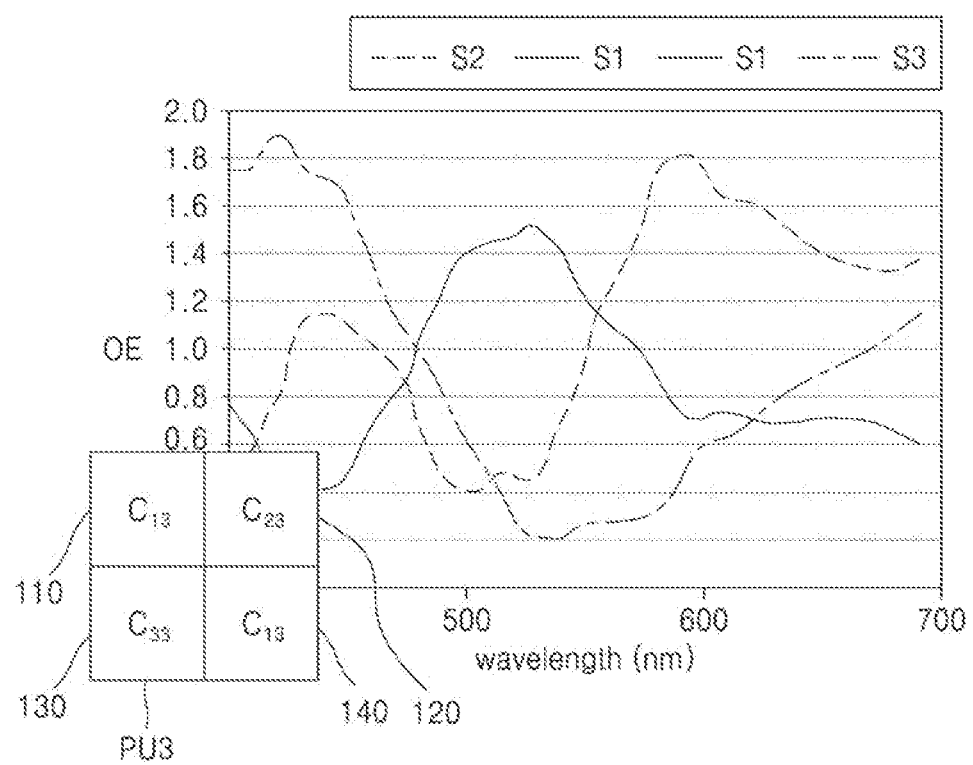
Figure 6D:
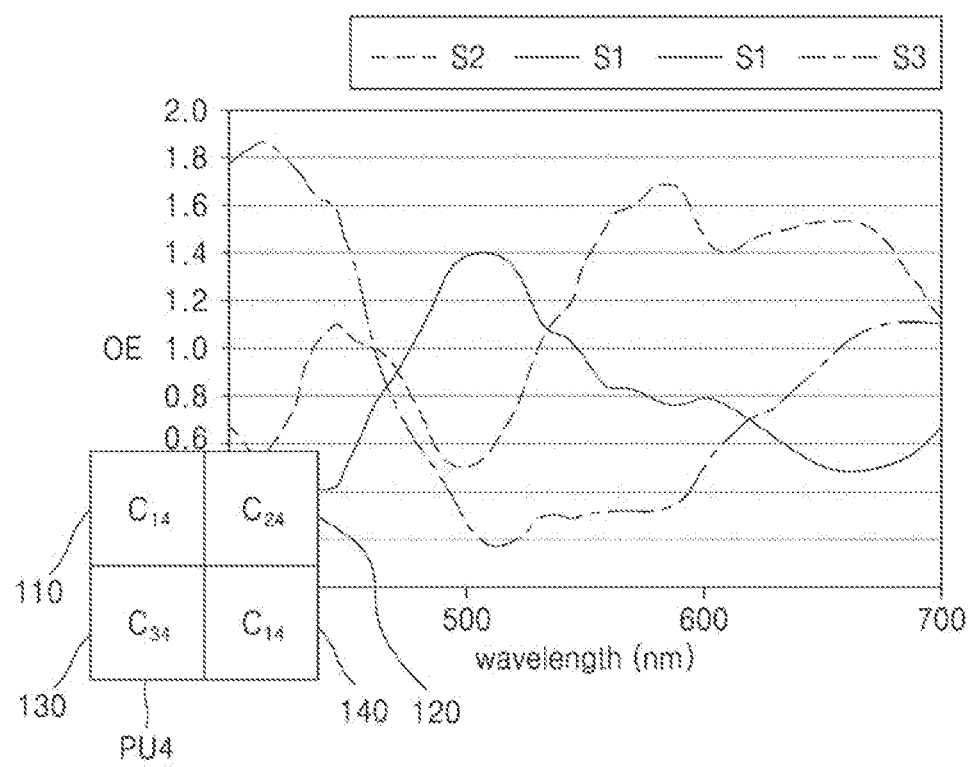

FIG. 5 is a conceptual view illustrating that incident light Li has different spectra according to the distance from the color separation lens array 700 in the image sensor 1000 of the example embodiment, and FIGS. 6A to 6D are graphs illustrating spectra of incident light separated by the first, second, and third photosensitive cells 110, 120, and 130 for different optical distances OL between the color separation lens array 700 and the light detector 100 in the image sensor 1000 of the example embodiment.

Referring to FIG. 5, the incident light Li has a predetermined target phase distribution immediately after passing through the color separation lens array 700. Different spectrum patterns are separated from the light Li in different regions according to the distance that the light Li has traveled. Different colors (or wavelength distributions) are presented on unit pixels, which have a pattern similar to a Bayer pattern and are formed at optical distances Z1, Z2, Z3, and Z4. In FIG. 4, the unit pixels are denoted with PU1 at the distance Z1, PU2 at the distance Z2, PU3 at the distance Z3, and PU4 at the distance Z4. The color of each unit pixel is a mixture of red, green, and blue in different proportions. This is merely an example, and in another example, a unit pixel expressed by green, blue, green, and blue may be formed at a certain position. In FIG. 5, the pattern structures PS are illustrated as having a circular post shape, but the pattern structures PS are not limited thereto. The pattern structures PS may be nano-posts having various cross-sectional shapes such as a polygon shape, an ellipse shape, a circular ring shape, a polygonal ring shape, and a cross shape.

In FIGS. 6A to 6D, S1 refers to the spectrum of light incident on the first photosensitive cells 110 and fourth photosensitive cells 140, S2 refers to the spectrum of light incident on the second photosensitive cells 120, and S3 refers to the spectrum of light incident on the third photosensitive cells 130. Colors (or wavelength distributions) sensed by the first photosensitive cells 110, the second photosensitive cells 120, the third photosensitive cells 130, and the fourth photosensitive cells 140 according to the incident spectra are denoted with $C_{1k}$, $C_{2k}$, and $C_{3k}$. k is an index for denoting the distances Z1, Z2, Z3, and Z4 with 1, 2, 3, and 4.

Colors (or wavelength distributions) $C_{ik}$ (i=1, 2, and 3 and k=1, 2, 3, and 4) may all be different from each other, some of the colors Cik may be very similar to each other, or some of the colors Cik may be red, green, and blue.

When the color of an object is restored using a plurality of optical signal sets sensed at different distances as described above, reproduction may be possible with high spectroscopic sensitivity compared to the case of using only three colors: red, green, and blue.

RGB-based graphic technology of the related art has limitations in that colors are expressed by the simple sums of RGB spectral weights, and thus, it is difficult to apply the RGB-based graphic technology to various lighting environments or media. In addition, when a global multi-spectrum is obtained to increase color reproducibility, a large number of channels may be required, and thus, spatial resolution may decrease.

Because the image sensor 1000 of the example embodiment obtains images from a plurality of optical signal sets obtained by varying the optical distance OL, the color reproducibility of the image sensor 1000 may be improved without decreasing the spatial resolution of the image sensor 1000.

Figure 7:
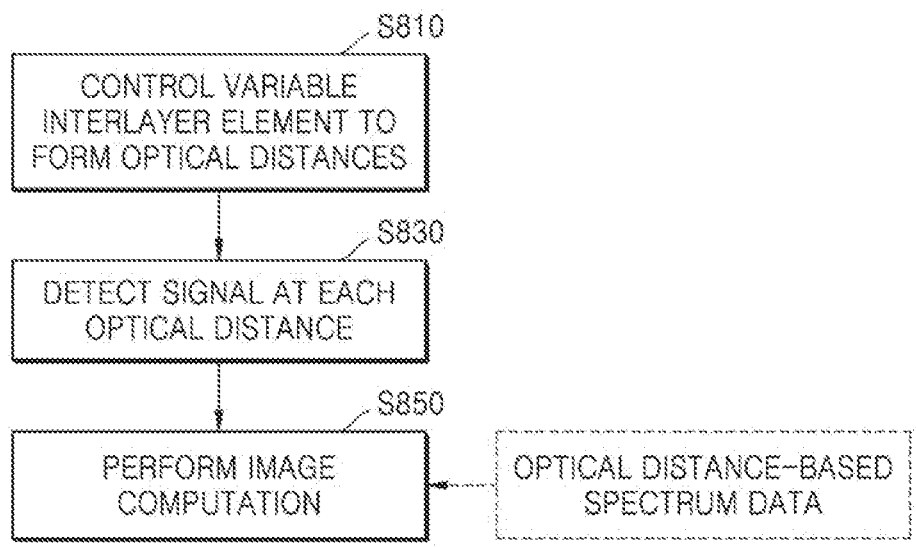
FIG. 7 is a flow chart schematically illustrating image acquisition processes of the image sensor according to an example embodiment.

FIG. 7 is a flowchart schematically illustrating image acquisition processes of the image sensor 1000 according to an example embodiment.

The processor 1040 controls the variable interlayer element 500 to form a plurality of different optical distances (S810). The optical distances may be determined by considering a light collection pattern according to the propagation distance of light having a phase distribution immediately after passing through the color separation lens array 700. The light collection pattern according to the propagation distance may depend on the wavelength λ of incident light and the pixel size (p) of the light detector 100. The variable range of the optical distances may be determined by considering the light collection pattern according to the propagation distance. The minimum optical distance may be, for example, about 1λ or more. The pixel size (p) may be expressed as the distance between adjacent photosensitive cell centers. For example, the minimum optical distance may be within the range of about 1λ or more, or within the range of about 1 p to about 3 p. For example, the variable optical distance may be within the range of about 500 nm to about 5 μm.

The processor 1040 may vary the physical distance between the light detector 100 and the color separation lens array 700 according to the type of the variable interlayer element 500, or may apply a signal to the variable interlayer element 500 to vary the refractive index of a medium between the light detector 100 and the color separation lens array 700. When an optical distance is set by the operation of the variable interlayer element 500, the light detector 100 senses an optical signal at the optical distance (S830). In this manner, a plurality of optical signal sets may be obtained for a plurality of optical distances. The processor 1040 may perform computations to obtain image data by using such optical signals (S850), and in the processing, spectrum data previously acquired according to optical distances for the color separation lens array 700 and the light detector 100 may be used. That is, as illustrated in FIGS. 6A to 6D, the arrangement of colors (wavelength distributions) of unit pixels may vary depending on optical distances, and unit pixel data may be previously prepared according to each of a plurality of optical distances to be set by the operation of the variable interlayer element 500. Artificial intelligence (AI)-based computational techniques may be used for computation thereof. Because image information included in incident light is acquired by using a plurality of optical signal sets which are proportional to the number of set optical distances, when the light detector 100 includes an Q×Q cell array, data corresponding to an m(Q×Q) array may be obtained, wherein m refers to the number of optical distances.

Example configurations of variable interlayer elements and image sensors including the variable interlayer elements will be described according to example embodiments with reference to FIGS. 8 to 11.

Figure 8:
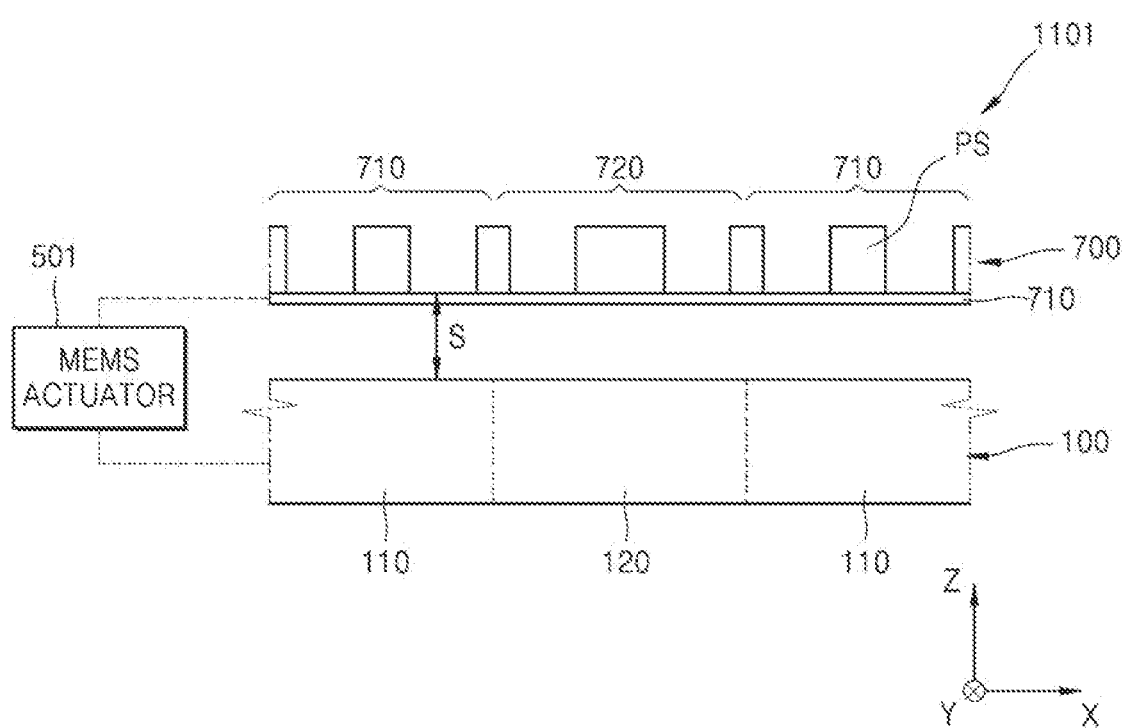
FIG. 8 is a cross-sectional view schematically illustrating a pixel array configuration of an image sensor according to another example embodiment.

FIG. 8 is a cross-sectional view schematically illustrating a pixel array configuration of an image sensor 1001 according to another example embodiment.

A pixel array 1101 includes a color separation lens array 700, a light detector 100, and a variable interlayer element.

The variable interlayer element may include a microelectromechanical system (MEMS) actuator 501 configured to vary a physical distance S between the color separation lens array 700 and the light detector 100. A medium between the color separation lens array 700 and the light detector 100 may be air, and thus, a support layer 710 for supporting the pattern structures PS may be provided.

The support layer 710 and the light detector 100 are electromechanically connected to the MEMS actuator 501 such that the position of the support layer 710 may be varied with respect to the light detector 100 according to the operation of the MEMS actuator 501. Therefore, the physical distance S between the color separation lens array 700 and the light detector 100 may be adjusted.

Figure 9:
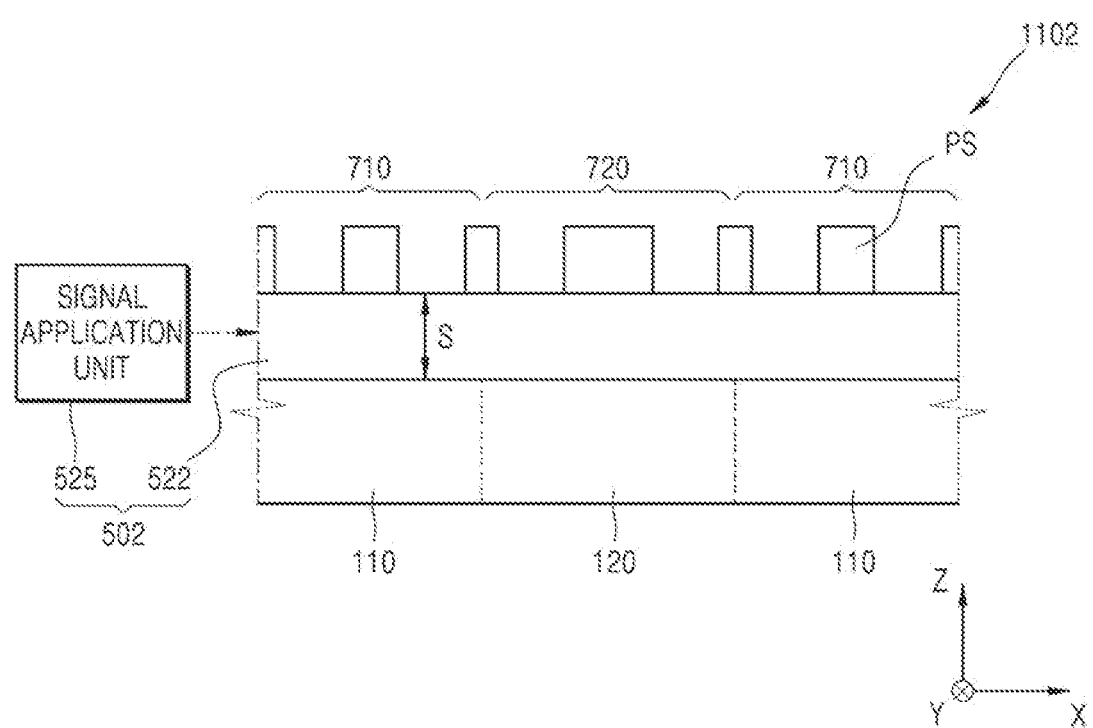
FIG. 9 is a cross-sectional view schematically illustrating a pixel array configuration of an image sensor according to another example embodiment.

FIG. 9 is a cross-sectional view schematically illustrating a pixel array configuration of an image sensor 1002 according to another example embodiment.

A pixel array 1102 includes a color separation lens array 700, a light detector 100, and a variable interlayer element 502.

The variable interlayer element 502 includes: a variable shape structure 522 including a variable shape material which is variable in shape in response to an electrical signal to change a physical distance S between the color separation lens array 700 and the light detector 100; and a signal application unit 525 configured to apply an electrical signal to the variable shape structure 522.

The variable shape material included in the variable shape structure 522 may be, for example, a shape memory alloy (SMA) or an electro-active polymer. The variable shape structure 522 may be embodied in various forms, and the specific shape of the variable shape structure 522 is not shown. The variable shape structure 522 may have various shapes combined with a member having a predetermined shape and fixing the variable shape material. However, the variable shape structure 522 is not limited thereto, and in another example, the variable shape structure 522 may be entirely formed of the variable shape material. The shape of the variable shape material may be varied in response to a signal applied from the signal application unit 525, and thus, the physical distance S between the light detector 100 and the color separation lens array 700 may be varied.

Figure 10:
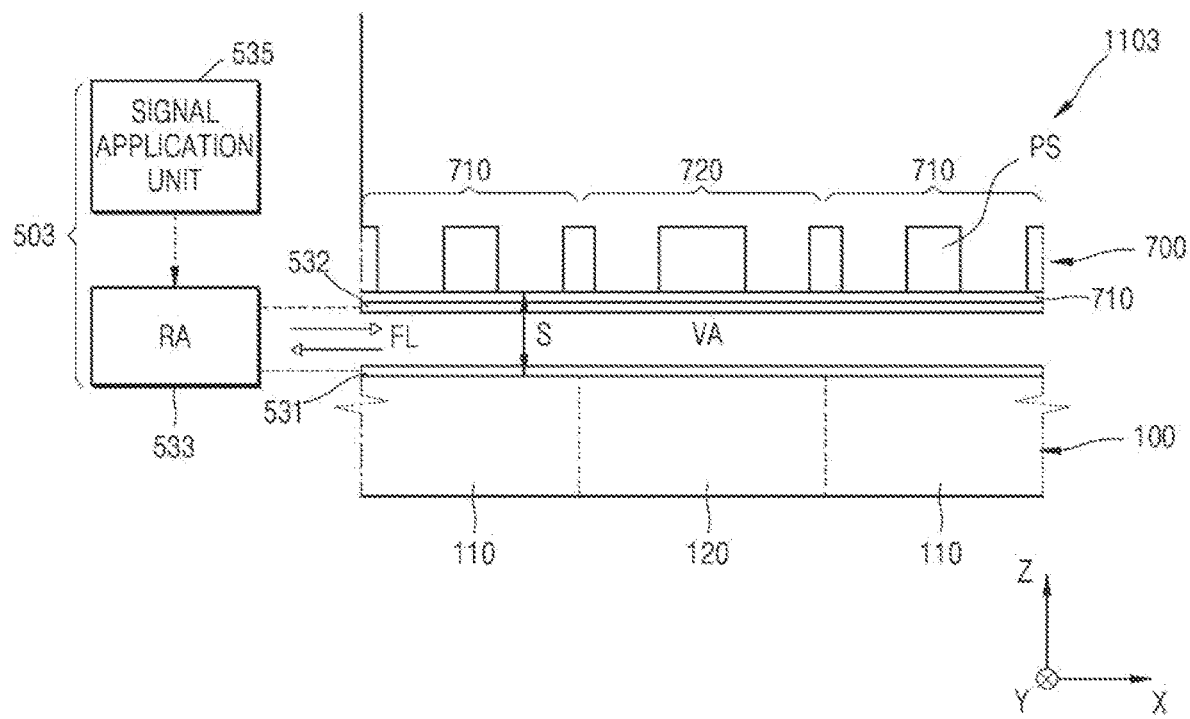
FIG. 10 is a cross-sectional view schematically illustrating a pixel array configuration of an image sensor according to another example embodiment.

FIG. 10 is a cross-sectional view schematically illustrating a pixel array configuration of an image sensor 1003 according to another example embodiment.

A pixel array 1103 includes a color separation lens array 700, a light detector 100, and a variable interlayer element 503.

The variable interlayer element 503 includes: a frame structure 533 including a reservoir region RA and a variable height region VA; and a signal application unit 535 configured to move an optical fluid FL from the reservoir region RA to the variable height region VA.

The variable height region VA is a region between the color separation lens array 700 and the light detector 100, and may include a stretchable membrane 532 and a fixing member 531 configured to support the stretch deformation of the stretchable membrane 532. The stretchable membrane 532, the fixing member 531, the reservoir region RA, and the variable height region VA may form the frame structure 533.

The signal application unit 535 may apply hydraulic pressure to the reservoir region RA to move the optical fluid FL to the variable height region VA. Alternatively, additional elements such as electrodes for moving a fluid may be provided in the reservoir region RA or the variable height region VA such that the optical fluid FL may be moved as the signal application unit 545 applies an electrical signal to the additional elements.

When the optical fluid FL flows between the reservoir region RA and the height variable region VA, the stretchable membrane 532 of the height variable region VA may be stretched or shrunk according to the amount of the optical fluid FL, and thus, the height of the variable height region VA may be adjusted. As the height of the variable height region VA is adjusted, the physical distance S between the color separation lens array 700 and the light detector 100 may be adjusted.

Although FIG. 10 illustrates a support layer 710 configured to support pattern structures PS, the image sensor 1003 is not limited thereto. For example, the support layer 710 may be omitted, and the pattern structures PS may be supported by the stretchable membrane 532.

Figure 11:
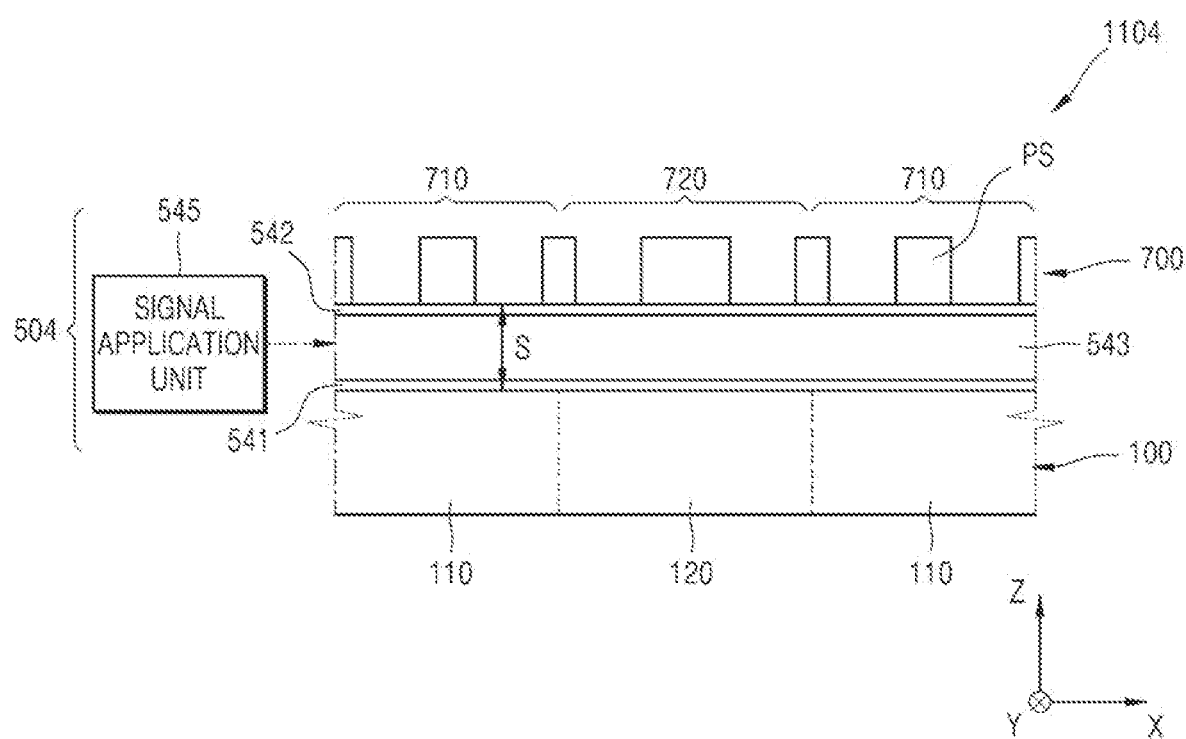
FIG. 11 is a cross-sectional view schematically illustrating a pixel array configuration of an image sensor according to another example embodiment.

FIG. 11 is a cross-sectional view schematically illustrating a pixel array configuration of an image sensor 1004 according to another example embodiment.

A pixel array 1104 includes a color separation lens array 700, a light detector 100, and a variable interlayer element 504.

The variable interlayer element 504 includes a variable refractive index layer 543 having a refractive index variable in response to a signal input from the outside; and a signal application unit 545 configured to apply an electrical signal to the variable refractive index layer 543. Transparent electrodes 541 and 542 may be arranged on upper and lower surfaces of the variable refractive index layer 543.

The variable refractive index layer 543 may include a material of which optical characteristics are variable in response to an external signal. The external signal may be an electrical signal. The variable refractive index layer 543 may include, for example, an electro-optic material having an effective dielectric constant variable in response to an electrical signal. Examples of a material that may be included in the variable refractive index layer 543 may include $LiNbO_3$, $LiTaO_3$, potassium tantalate niobate (KTN), lead zirconate titanate (PZT), and liquid crystal, and may also include various polymer materials having electro-optic characteristics. The external signal is not limited to an electrical signal, and for example, the variable refractive index layer 543 may include $VO_2$, $VO_2O_3$, EuO, MnO, CoO, $CoO_2$, $LiCoO_2$, $Ca_2RuO_4$, or the like which undergoes a phase transition and thus varies in refractive index at a certain temperature or higher in response to heat applied thereto.

When the refractive index of the variable refractive index layer 543 is varied in response to a signal applied from the signal application unit 545, an optical distance expressed by the product of the refractive index and a physical distance S is also varied.

Figure 12:
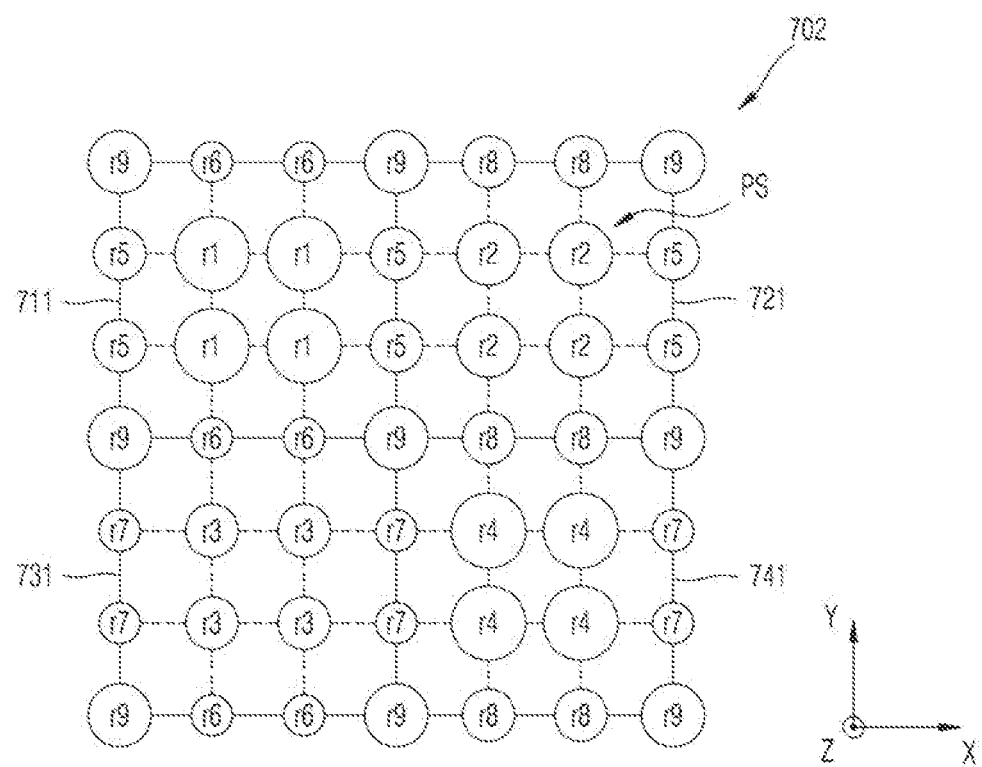
FIG. 12 is an example plan view illustrating a unit pattern array of a color separation lens array provided in an image sensor according to another example embodiment.

FIG. 12 is an example plan view illustrating a unit pattern array of a color separation lens array 701 provided in an image sensor according to another example embodiment.

The color separation lens array 701 may have a pixel array corresponding to the Bayer pattern-like pixel arrangement illustrated in FIG. 4A and may include quadrant regions including a first region 711 corresponding to a first pixel P1, a second region 721 corresponding to a second pixel P2, a third region 731 corresponding to a third pixel P3, and a fourth region 741 corresponding to a first pixel P1. Such unit pattern arrays may be repeatedly arranged in a first direction (X direction) and a second direction (Y direction). Each region may be divided into a plurality of sub-regions, and pattern structures PS may be arranged at intersections of the boundaries of the sub-regions. FIG. 12 shows an example in which: the number of sub-regions is nine for each region; pattern structures PS are arranged at grid points defining the nine sub-regions; no pattern structure PS is arranged at the center of each of the first, second, third, and fourth regions 711, 721, 731, and 741; and four pattern structures PS having the same size form a center portion of each of the first, second, third, and fourth regions 711, 721, 731, and 741. Pattern structures PS in a peripheral portion are arranged on the boundaries between regions. The pattern structures PS are denoted with r1 to r9 according to the positions of the pattern structures PS in the unit pattern array.

Referring to FIG. 12, pattern structures r1 arranged in the center portion of the first region 711 corresponding to the first pixel P1 have a larger cross-sectional area than peripheral pattern structures r5, r6, and r9, and pattern structures r4 arranged in the central portion of the fourth region 741 corresponding to the first pixel P1 also have a larger cross-sectional area than peripheral pattern structures r7, r8, and r9. The cross-sectional sizes of the pattern structures r1 and r4 arranged in the center portions of the first and fourth regions 711 and 741 corresponding to the first pixels P1 may be greater than the cross-sectional size of pattern structures r2 arranged in the center portion of the second region 721 corresponding to the second pixel P2 and the cross-sectional size of pattern structures r3 arranged in the center portion of the third region 731 corresponding to the third pixel P3. The cross-sectional area of the pattern structures r2 arranged in the center portion of the second region 721 corresponding to the second pixel P2 may be greater than the cross-sectional area of the pattern structure r3 arranged in the center portion of the third region 731 corresponding to the third pixel P3.

The pattern structures PS of the second region 721 and the third region 731 may be symmetrically arranged in the first direction (X direction) and the second direction (Y direction), and the pattern structures PS of the first region 711 and the fourth region 741 may be asymmetrically arranged in the first direction (X direction) and the second direction (Y direction). In other words, the pattern structures PS of the second region 721 and the third region 731 respectively corresponding to the second pixel P2 and the third pixel P3 may arranged according to the distribution rules in the first direction (X direction) and the second direction (Y direction), and the pattern structures PS of the first region 711 and the fourth region 741 corresponding to the first pixels P1 may be arranged according to different distribution rules in the first direction (X direction) and the second direction (Y direction).

The cross-sectional area of the pattern structures r5 positioned at a boundary of the first region 711 adjacent to the second region 721 in the first direction (X direction) is different from the cross-sectional area of the pattern structures r6 positioned at a boundary of the first region 711 adjacent to the third region 731 in the second direction (Y direction). In addition, the cross-sectional area of the pattern structures r7 positioned at a boundary of the fourth region 741 adjacent to the third region 731 in the first direction (X direction) is different from the cross-sectional area of the pattern structures r8 positioned at a boundary of the fourth region 741 adjacent to the second region 721 in the second direction (Y direction).

However, the cross-sectional area of the pattern structures r5 positioned at the boundary of the first region 711 adjacent to the second region 721 in the first direction (X direction) is equal to the cross-sectional area of the pattern structures r8 positioned at the boundary of the fourth region 741 adjacent to the second direction (Y direction), and the cross-sectional area of the pattern structures r6 positioned at a boundary of the first region 711 adjacent to the third region 731 in the second direction (Y direction) is equal to the cross-sectional area of the pattern structures r7 positioned at the boundary of the fourth region 741 adjacent to the third region 731 in the first direction (X direction).

In addition, the pattern structures r9, which are arranged at the four corners of each of the first region 711, the second region 721, the third region 731, and the fourth region 741, that is, at positions at which the four regions meet each other, have the same cross-sectional area.

As described above, pattern structures PS are arranged in 4-fold symmetry in the second region 721 and the third region 731 which respectively correspond to the second pixel P2 and the third pixel P3, and pattern structures PS are arranged with 2-fold symmetry in the first and fourth regions 711 and 741 which correspond to the first pixels P1 such that the pattern structures PS of the first and fourth regions 711 and 741 may be rotated 90 degrees from each other. This form also applies to example embodiments shown in FIGS. 13 and 14.

Figure 13:
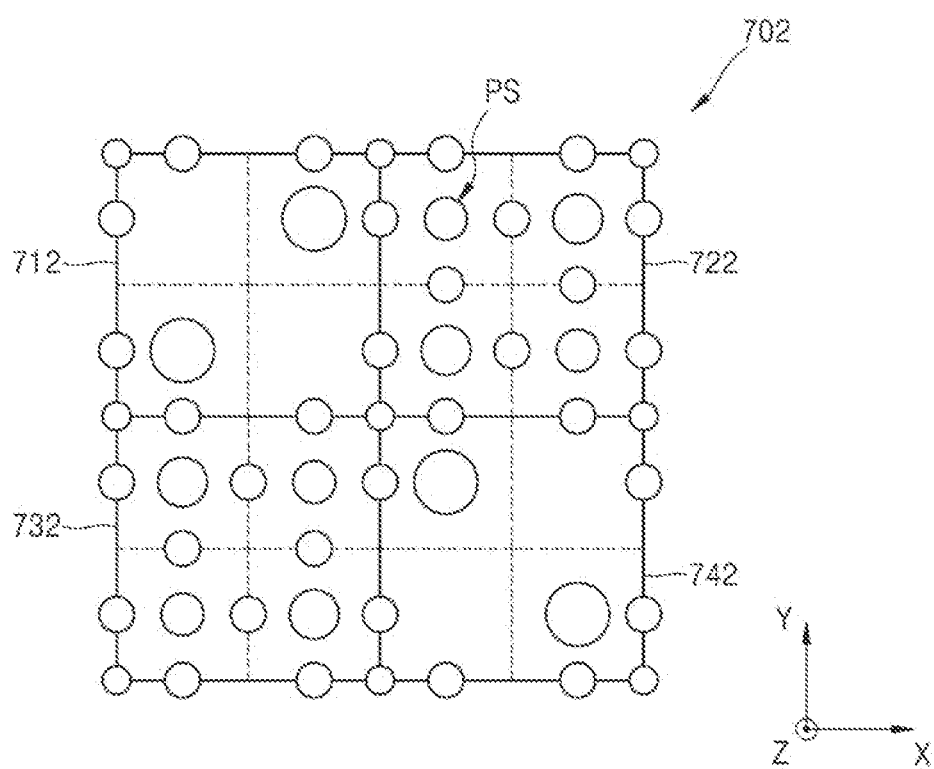
FIG. 13 is an example plan view illustrating a unit pattern array of a color separation lens array provided in an image sensor according to another example embodiment.

FIG. 13 is a plan view schematically illustrating a color separation lens array 702 provided in a pixel array of an image sensor according to another example embodiment.

In the present example embodiment, each of a first region 712, a second region 722, a third region 732, and a fourth region 742 included in the color separation lens array 702 may be divided into a plurality of sub-regions, and at least a portion of one pattern structure PS may be positioned in each of the sub-regions. Pattern structures PS may not be arranged on center portions of some of the sub-regions, but may be arranged only on boundaries of the sub-regions. Although it is illustrated that the number of sub-regions of each region is four, this is a non-limiting example.

Also in the present example embodiment, pattern structures PS of the second region 722 and the third region 732 may be arranged according to the same arrangement rules in a first direction (X direction) and a second direction (Y direction), and pattern structures PS of the first region 712 and the fourth region 742 may be arranged according to different arrangement rules in the first direction (X direction) and the second direction (Y direction). The arrangement of the pattern structures PS in the first region 712 and the arrangement of the pattern structures PS in the fourth region 742 may be rotated 90 degrees with respect to each other.

In the above description, color separation lens arrays which include pattern structures having a post shape and arranged in definable forms have been described. However, color separation pattern arrays having non-definable free patterns may also be implemented. Hereinafter, examples of various free forms that may be employed in color separation lens arrays will be described.

Figure 14:
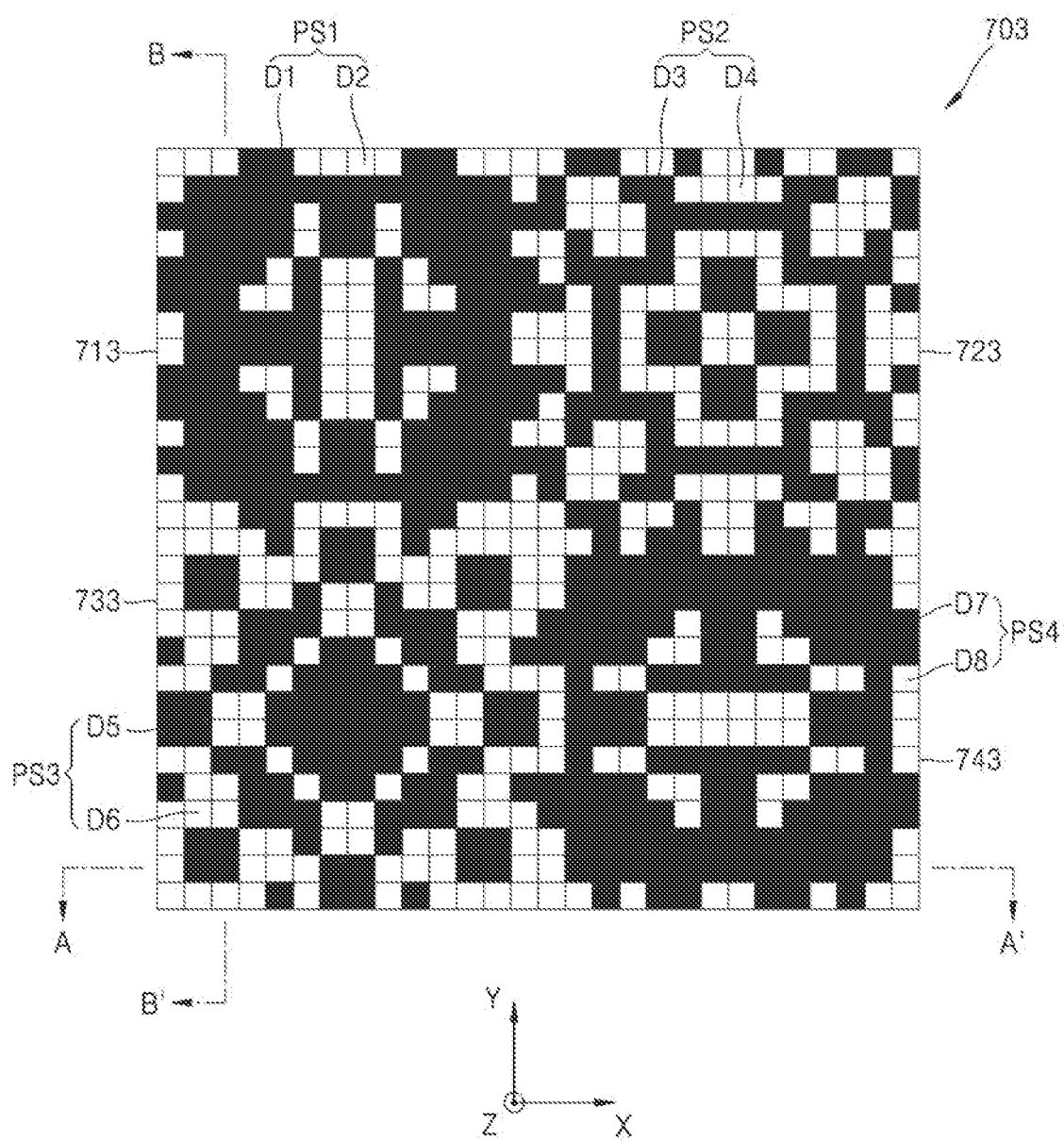
FIG. 14 is an example plan view schematically illustrating a unit pattern array of a color separation lens array provided in an image sensor according to another example embodiment.

FIG. 14 is a plan view schematically illustrating a color separation lens array 703 provided in a pixel array of an image sensor according to another example embodiment.

The color separation lens array 703 shown in FIG. 14 may be applied to an image sensor in which pixels are arranged in the form of a Bayer pattern, and FIG. 14 shows four regions of a unit pattern array. The color separation lens array 703 includes a first pattern structure PS1 formed in a first region 713, a second pattern structure PS2 formed in a second region 723 and having a shape different from the shape of the first pattern structure PS1, a third pattern structure PS3 formed in a third region 733 and having a shape different from the shapes of the first pattern structure PS1 and the second pattern structure PS2, and a fourth pattern structure PS4 formed in a fourth region 743.

The first pattern structure PS1 includes: a first dielectric D1 having a first refractive index and provided in a first form; and a second dielectric D2 having a second refractive index less than the first refractive index and filled in gaps of the first dielectric D1 having the first form. The first form is a free form defined without limitations except that the first dielectric D1 is present in any vertical cross-section of the first pattern structure PS1. Here, the term "vertical cross-section" refers to a cross-section taken along a straight line on an XY plane.

Similarly, the second pattern structure PS2 includes: a third dielectric D3 having a third refractive index and provided in a second form; and a fourth dielectric D4 having a fourth refractive index less than the third refractive index and filled in gaps of the third dielectric D3 having the second form. The second form may be determined such that the third dielectric D3 may be present in any vertical cross-section of the second pattern structure PS2.

Similarly, the third pattern structure PS3 includes: a fifth dielectric D5 having a fifth refractive index and provided in a third form; and a sixth dielectric D6 having a sixth refractive index less than the fifth refractive index and filled in gaps of the fifth dielectric D5 having the third form. The third form may be determined such that the fifth dielectric D5 may be present in any vertical cross-section of the third pattern structure PS3.

Similarly, the fourth pattern structure PS4 includes: a seventh dielectric D7 having a seventh refractive index and provided in a fourth form; and an eighth dielectric D8 having an eighth refractive index less than the seventh refractive index and filled in gaps of the seventh dielectric D7 having the fourth form. The fourth form may be determined such that the seventh dielectric D7 may be present in any vertical cross-section of the fourth pattern structure PS4. The fourth pattern structure PS4 may be in a form rotated 90 degrees from the first pattern structure PS1.

All the first dielectric D1, the third dielectric D3, the fifth dielectric D5, and the seventh dielectric D7 may include the same material, and all the second dielectric D2, the fourth dielectric D4, the sixth dielectric D6, and the eighth dielectric D8 may include the same material. For example, the first dielectric D1, the third dielectric D3, the fifth dielectric D5, and the seventh dielectric D7 may include a dielectric material having a high refractive index and a low absorptivity in a visual light band, such as $TiO_2$, GaN, $SiN_3$, ZnS, ZnSe, or $Si_3N_4$. In addition, the second dielectric D2, the fourth dielectric D4, the sixth dielectric D6, and the eighth dielectric D8 may include a dielectric material having a low refractive index and a low absorptivity in a visual light band, such as air, $SiO_2$, or silanol-based glass (for example, siloxane-based spin on glass (SOG)). For example, when the second dielectric D2, the fourth dielectric D4, the sixth dielectric D6, and the eighth dielectric D8 are air, the color separation lens array 703 may easily be formed by etching the first dielectric D1, the third dielectric D3, the fifth dielectric D5, and the seventh dielectric D7 in the form shown in FIG. 14.

FIGS. 15A, 15B, 15C, and 15D respectively illustrate the first region 713, the second region 723, the third region 733, and the fourth region 743 of the color separation lens array 703 of FIG. 14.

Figure 15A:
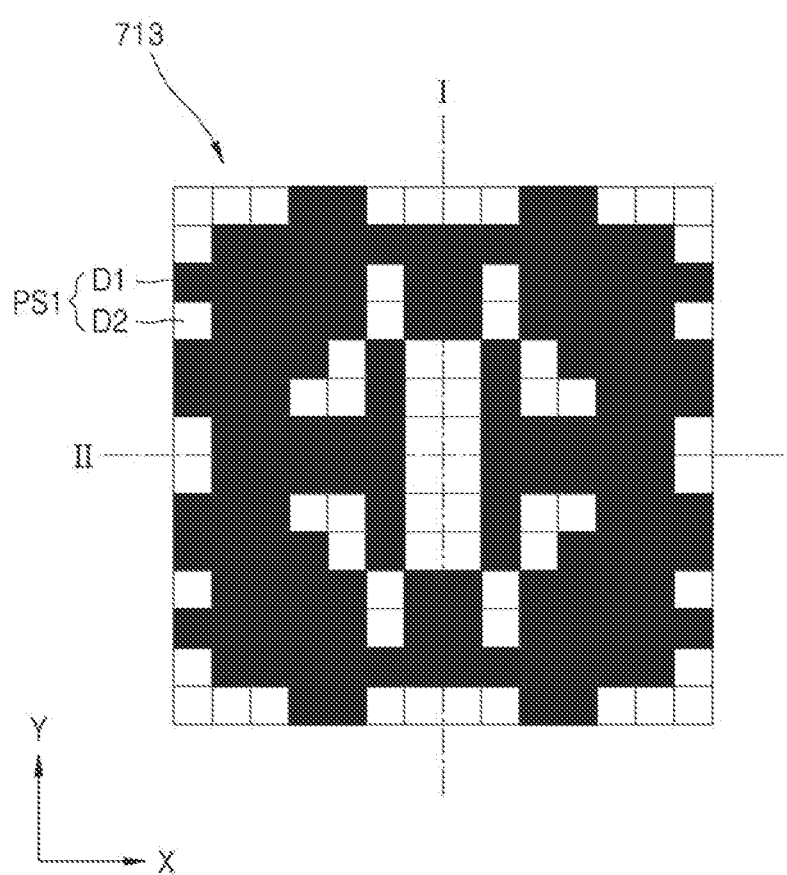
FIGS. 15A to 15D are plan views respectively illustrating first to fourth regions of the unit pattern array shown in FIG. 14.

As shown in FIG. 15A, the first pattern structure PS1 of the first region 713 may have a 2-fold symmetrical form. For example, the first pattern structure PS1 of the first region 713 may be symmetrical with respect to a first axis (I) defined in a Y direction and may also be symmetrical with respect to a second axis II defined in an X direction.

Figure 15B:
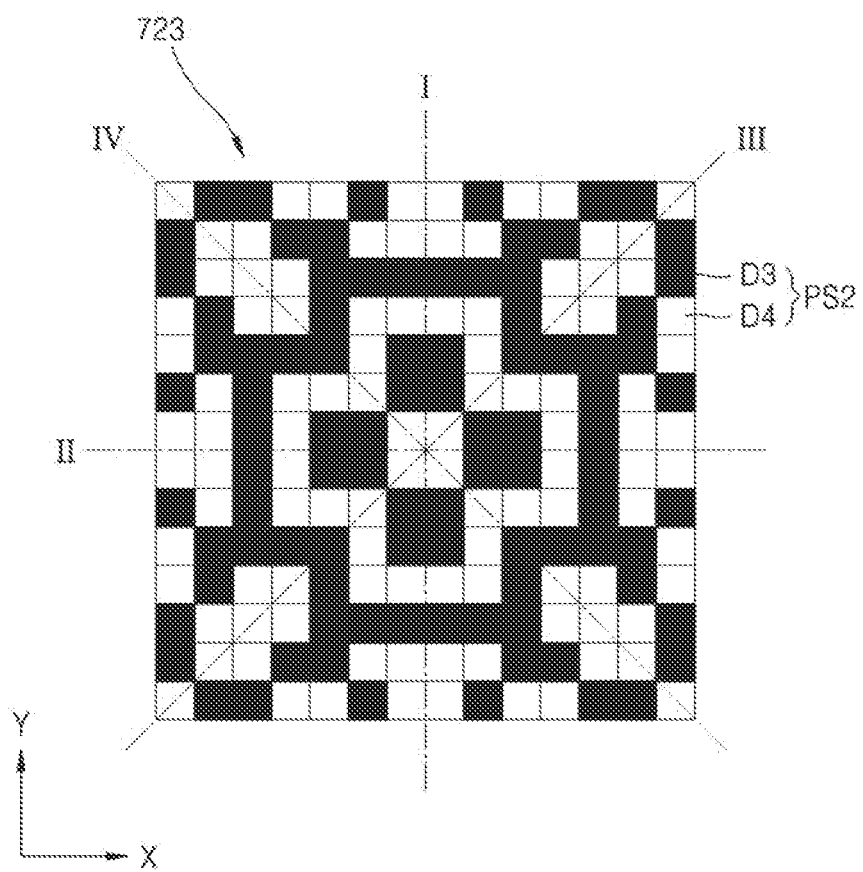

As shown in FIG. 15B, the second pattern structure PS2 of the second region 723 may have a 4-fold symmetrical form. For example, the second pattern structure PS2 of the second region 723 may be symmetrical with respect to a first axis (I) defined in the Y direction, a second axis II defined in the X direction, a third axis III defined in a diagonal direction, and a fourth axis IV defined in a diagonal direction.

Figure 15C:
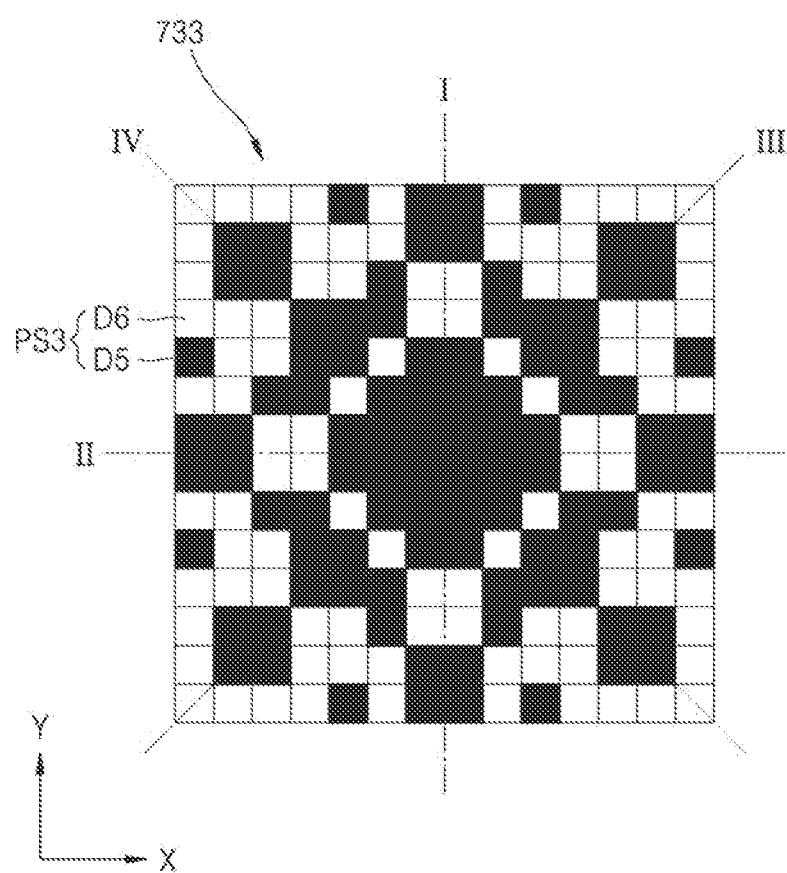

As shown in FIG. 15C, the third pattern structure PS3 of the third region 733 may have a 4-fold symmetrical form. For example, the third pattern structure PS3 of the third region 733 may be symmetrical with respect to a first axis (I) defined in the Y direction, a second axis II defined in the X direction, a third axis III defined in a diagonal direction, and a fourth axis IV defined in a diagonal direction.

Figure 15D:
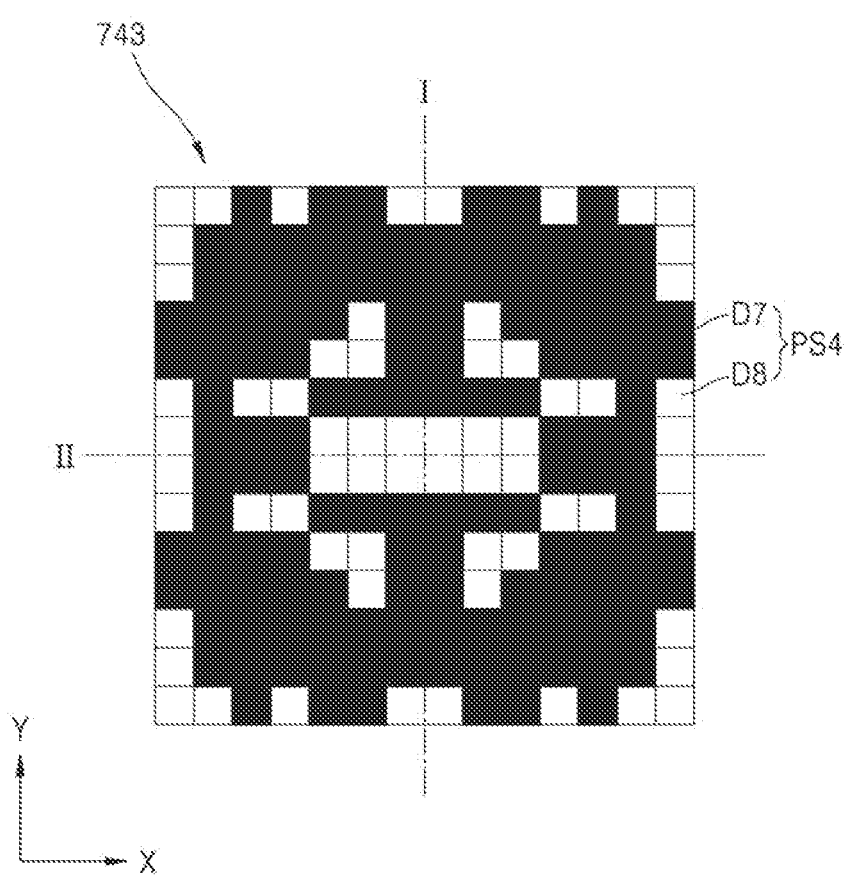

As shown in FIG. 15D, the fourth pattern structure PS4 of the third region 743 may be symmetrical with respect to a first axis (I) defined in the Y direction and a second axis II defined in the X direction. The fourth pattern structure PS4 of the fourth region 743 may have the same form as that obtained by rotating the first pattern structure PS1 of the first region 713 by 90 degrees.

The symmetry of each of the first pattern structure PS1, the second pattern structure PS2, the third pattern PS3, and the fourth pattern structure PS4 respectively provided in the first region 713, the second region 723, the third region 733, and the fourth region 743 are determined by considering the arrangement of a pixel corresponding thereto and pixels adjacent thereto.

The four regions of the unit pattern array, that is, the first region 713, the second region 723, the third region 733, and the fourth region 743, respectively correspond to the first pixel P1, the second pixel P2, the third pixel P3, and the first pixel P1 of the pixel arrangement shown in FIG. 4A. In this arrangement, pixels adjacent to the second pixel P2 and the third pixel P3 in the first direction (X direction) and the second direction (Y direction) are the first pixels P1, and the first pixel P1 has the second pixel P2 as a pixel adjacent thereto in the first direction (X direction) and the third pixel P3 as a pixel adjacent thereto in the second direction (Y direction). By considering the symmetry of the pixel arrangement, the symmetry of each of the first pattern structure PS1, the second pattern PS2, the third pattern structure PS3, and the pattern structure PS4 respectively provided in the first region 713, the second region 723, the third region 733, and the fourth region 743 may be determined.

The shape of the color separation lens array 703 shown in FIG. 14 is an example, and the color separation lens array 703 may have any other shape as long as light has a target phase distribution immediately after passing through the color separation lens array 703.

The shape of the color separation lens array 703 that satisfies a target phase distribution may be automatically designed through various computer simulations. For example, the shape of the pattern structure of each region may be designed using a nature-inspired algorithm such as a genetic algorithm, a particle swarm optimization algorithm, and an ant colony optimization algorithm, or using a reverse engineering method based on an adjoint optimization algorithm.

When designing the color separation lens array 703, it is possible to optimize the pattern shape of each region of each unit pattern array while evaluating the performance of color separation lens array candidates according to evaluation factors such as color separation spectrum, optical efficiency, and signal-to-noise ratio. For example, the pattern shape of each region may be optimized by previously determining a target value for each evaluation factor and minimizing the sum of differences with the target values of the evaluation factors. Alternatively, performance indexes may be prepared for evaluation factors, and the pattern shape of each region may be optimized to result in maximum performance indexes.

Figure 16:
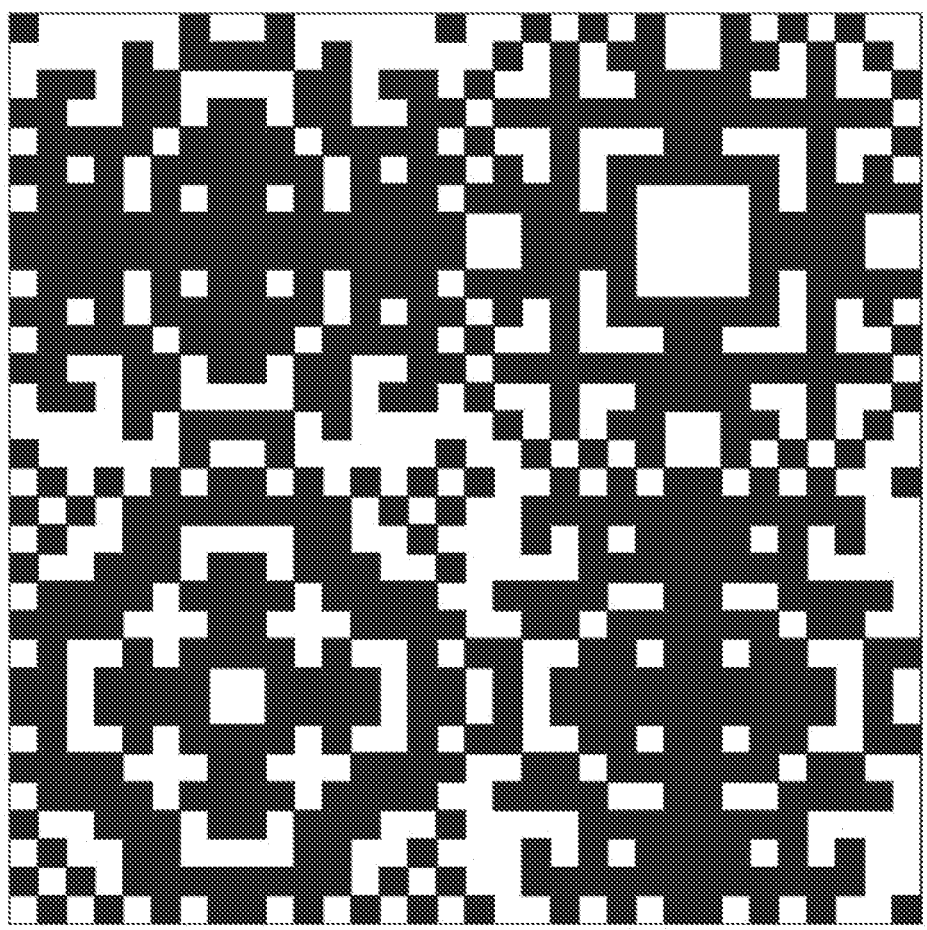
FIG. 16 is an example plan view illustrating a unit pattern array of a color separation lens array according to another example embodiment.
Figure 17:
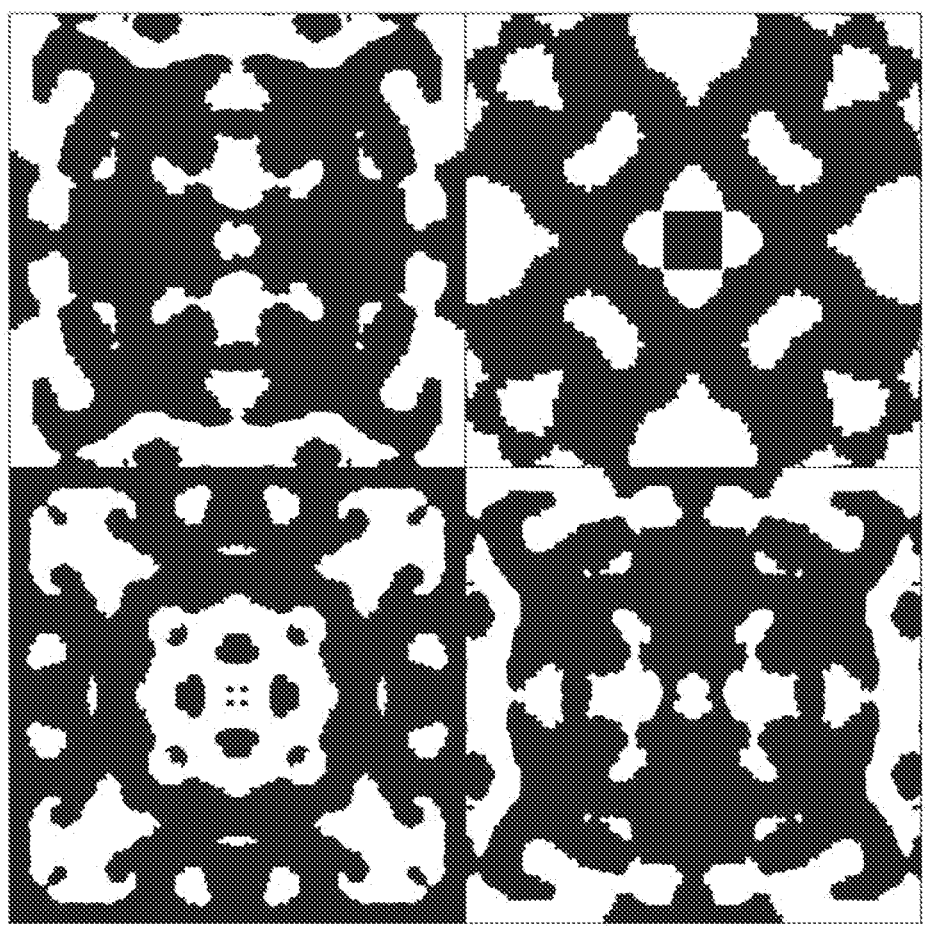
FIG. 17 is an example plan view illustrating a unit pattern array of a color separation lens array according to another example embodiment.

FIG. 16 is an example plan view illustrating a unit pattern array of a color separation lens array which is applicable to a Bayer-pattern image sensor according to another example embodiment, and FIG. 17 is an example plan view illustrating a unit pattern array of a color separation lens array which is applicable to a Bayer-pattern image sensor according to another example embodiment.

Each of the regions of the unit pattern array shown in FIG. 14 is optimized in a digitized binary form of a 14×14 rectangular array, and each region of the unit pattern array shown in FIG. 16 is optimized in a digitized binary form of a 16×16 rectangular array. Therefore, the unit pattern array of the color separation lens array 703 illustrated in FIG. 14 has a 28×28 rectangular array form, and the unit pattern array of the color separation lens array illustrated in FIG. 16 has a 32×32 rectangular array form. In this case, the vertical cross-sectional shape of each of the regions shown in FIGS. 14 and 16 may discontinuously vary as line A-A' moves in the Y direction or line B-B' moves in the X direction.

In addition, as shown in FIG. 17, each region of the unit pattern array may be optimized in a non-digitized continuous curve form. In this case, the vertical cross-sectional shape of each region continuously varies as line A-A' moves in the Y direction or line B-B' moves in the X direction as shown in FIG. 14.

The shapes and arrangements of the pattern structures PS of the color separation lens arrays illustrated in FIGS. 12 to 17 are examples, and various modifications may be made therein according to intended target phase distributions. In addition, the color separation lens arrays may be combined with various variable interlayer elements such as those illustrated in FIGS. 8 to 11.

The image sensors described above may be employed in various electronic devices. Because the image sensors described above provide object information having high spectroscopic sensitivity, the image sensors may be used in spectroscopic devices, inspection devices, photographing devices, and the like. Non-limiting examples of such electronic devices may include smartphones, cellular phones, mobile phones, personal digital assistants (PDAs), laptop computers, personal computers (PCs), various portable devices, and other mobile or non-mobile computing devices.

Figure 18:
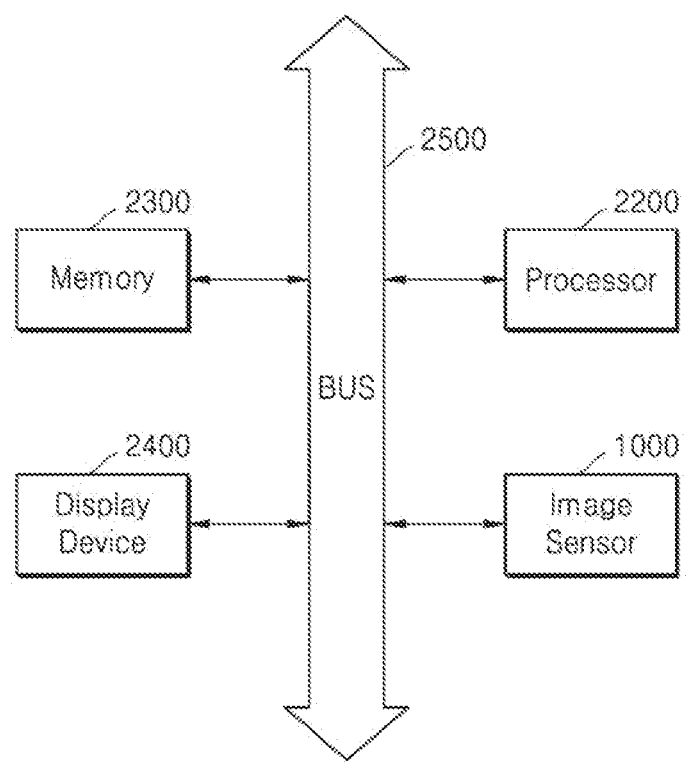
FIG. 18 is a block diagram schematically illustrating an electronic device including an image sensor according to an example embodiment.

For example, FIG. 18 is a schematic block diagram illustrating an electronic device including an image sensor according to an example embodiment. The electronic device includes an image sensor 1000, a processor 2200, a memory 2300, a display 2400, and a bus 2500. The image sensor 1000 acquires image information on an external object under the control of the processor 2200 and provides the image information to the processor 2200. The processor 2200 may store the image information received from the image sensor 1000 in the memory 2300 through the bus 2500. The processor 2200 may output the image information stored in the memory 2300 to the display 2400 for showing the image information to a user. In addition, as described above, the processor 2200 may variously process the image information received from the image sensor 1000.

FIGS. 19 to 29 illustrate various examples of multimedia devices as electronic devices to which image sensors are applied according to example embodiments.

Figure 19:
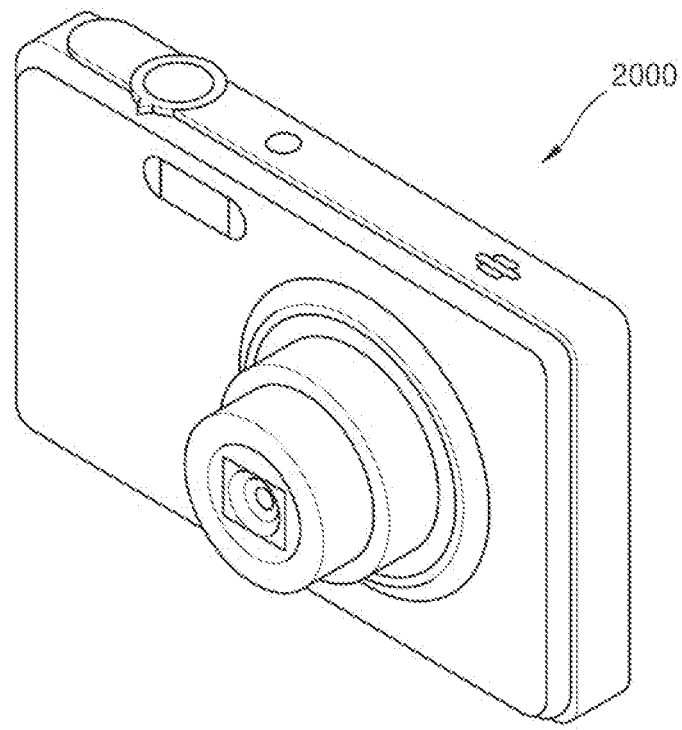
FIGS. 19 to 29 are views illustrating various multimedia devices as examples of electronic devices to which images sensors are applied according to example embodiments.

The image sensors of the example embodiments may be applied to various multimedia devices having an image capturing function. For example, an image sensor may be applied to a camera 2000 as shown in FIG. 19. The camera 2000 may be a digital camera or a digital camcorder.

Figure 20:
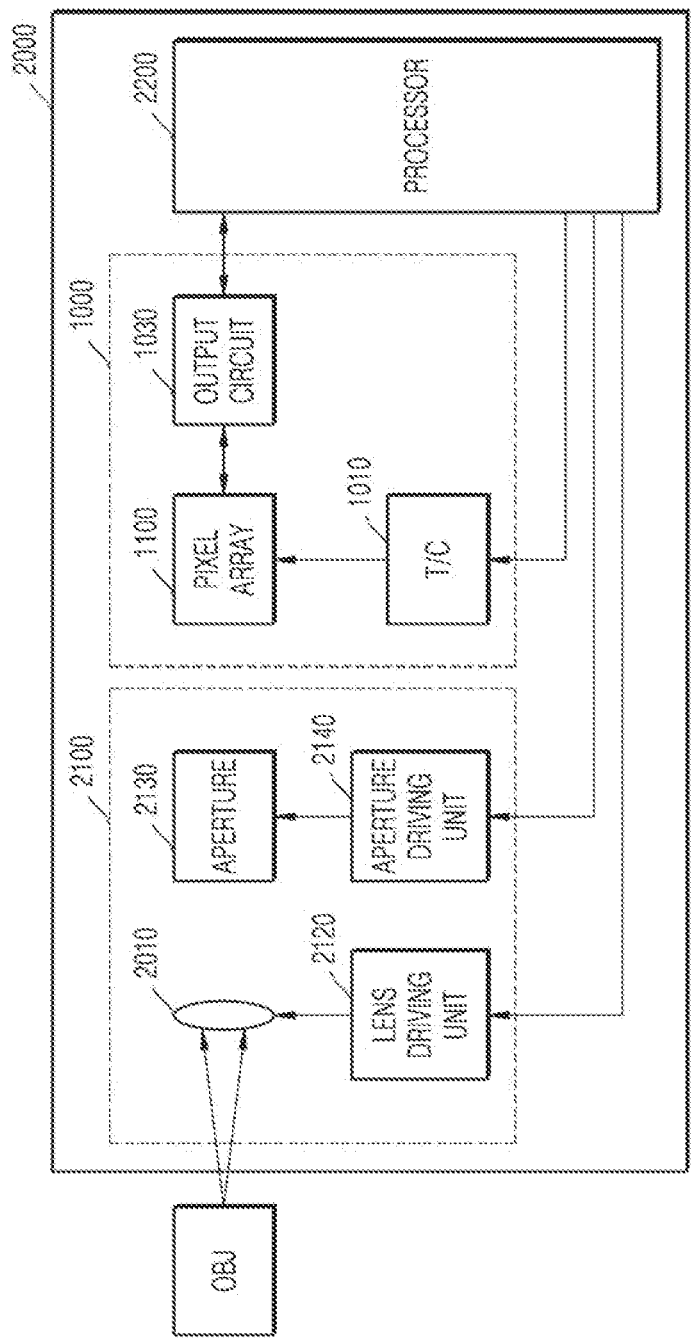

Referring to FIG. 20, the camera 2000 may include an imaging unit 2100, an image sensor 1000, and a processor 2200.

The imaging unit 2100 forms an optical image by condensing light reflected from an object OBJ. The imaging unit 2100 may include an objective lens 2010, a lens driving unit 2120, a aperture 2130, and a aperture driving unit 2140. Although only one lens element is shown in FIG. 20 for ease of illustration, the objective lens 2010 may include a plurality of lens elements having different sizes and shapes. The lens driving unit 2120 may communicate with the processor 2200 for information about focus detection and may adjust the position of the objective lens 2010 according to a control signal received from the processor 2200. The lens driving unit 2120 may move the objective lens 2010 to adjust the distance between the objective lens 2010 and the object OBJ, or may adjust the positions of the lens elements of the objective lens 2010. Focusing on the object OBJ may be adjusted as the lens driving unit 2120 drives the objective lens 2010. The camera 2000 may have an auto focus (AF) function.

In addition, the aperture driving unit 2140 may communicate with the processor 2200 for information on the amount of light and may adjust the aperture 2130 according to a control signal received from the processor 2200. For example, the aperture driving unit 2140 may increase or decrease the aperture of the aperture 2130 to adjust the amount of light entering the camera 2000 through the objective lens 2010, and may adjust the aperture opening time of the aperture 2130.

The image sensor 1000 may generate an electrical image signal based on the intensity of incident light. The image sensor 1000 may include a pixel array 1100, a timing controller 1010, and an output circuit 1030. The image sensor 1000 may further include a row decoder as shown in FIG. 1. Light passing through the objective lens 2010 and the aperture 2130 may form an image of the object OBJ on a light-receiving surface of the pixel array 1100. The pixel array 1100 may be a CCD or CMOS configured to convert optical signals into electrical signals. The pixel array 1100 may include additional pixels for performing an AF function or a distance measurement function. In addition, the pixel array 1100 may include one, a combination, or a modification of the color separation lens arrays 700, 701, 702, and 703 described with reference to FIGS. 12 to 17, and may also include any one of the variable interlayer elements 501, 502, 503, and 504 described with reference to FIGS. 8 to 11.

The processor 2200 may control the overall operation of the camera 2000 and may have an image processing function. For example, the processor 2200 may provide control signals for operations of devices such as the lens driving unit 2120, the aperture driving unit 2140, and the timing controller 1010.

As described above, the pixel array 1100 of the image sensor 1000 has a structure in which an optical distance between a light detector and a color separation lens array is adjustable such that the image sensor 1000 may form an image using a plurality of optical signal sets obtained at a plurality of optical distances, and thus, the camera 2000 including the image sensor 1000 may provide high-quality images having high color purity with high reproducibility.

Figure 21:
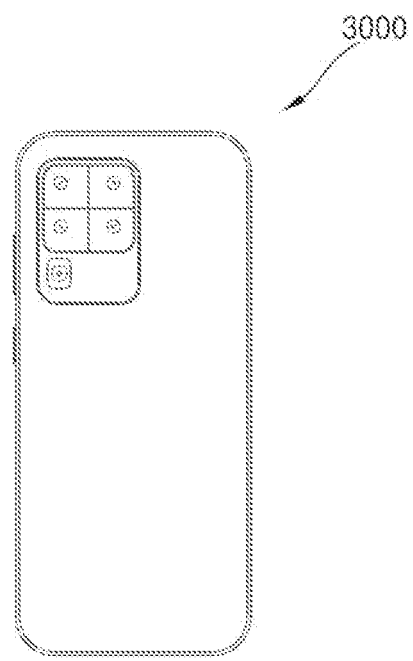
Figure 22:
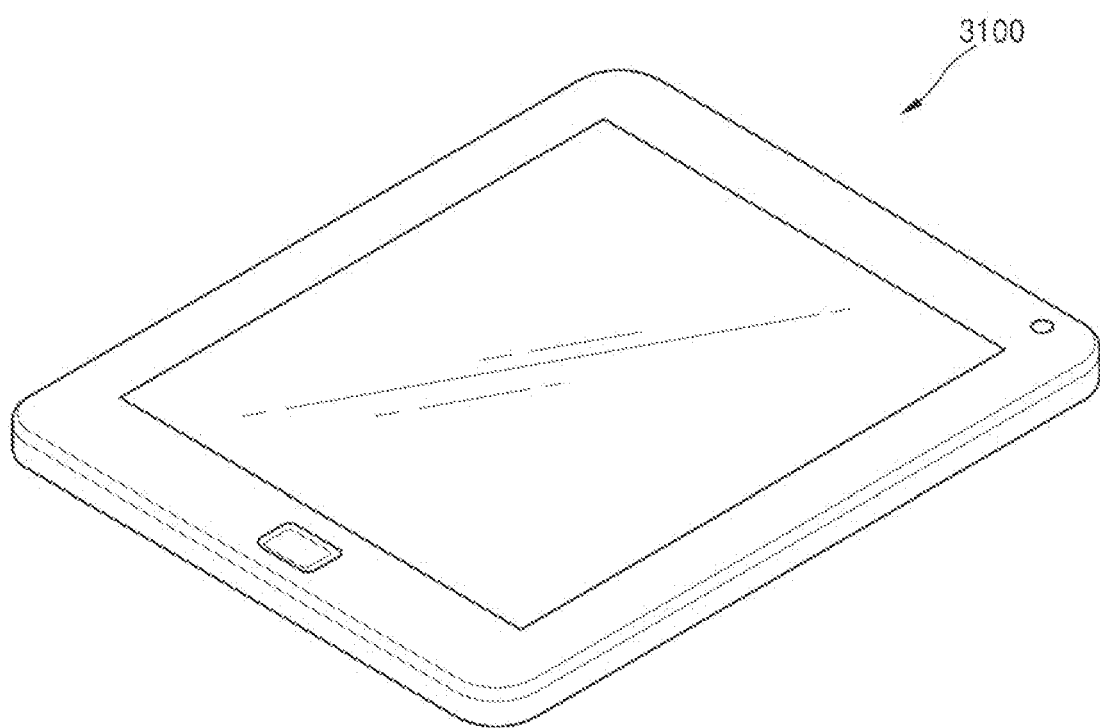
Figure 23:
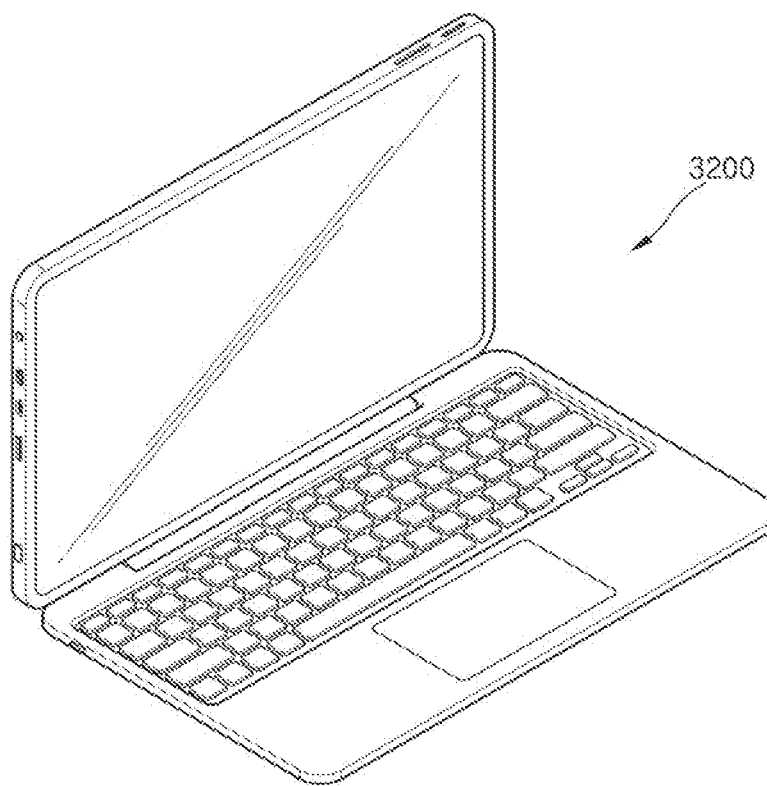
Figure 24:
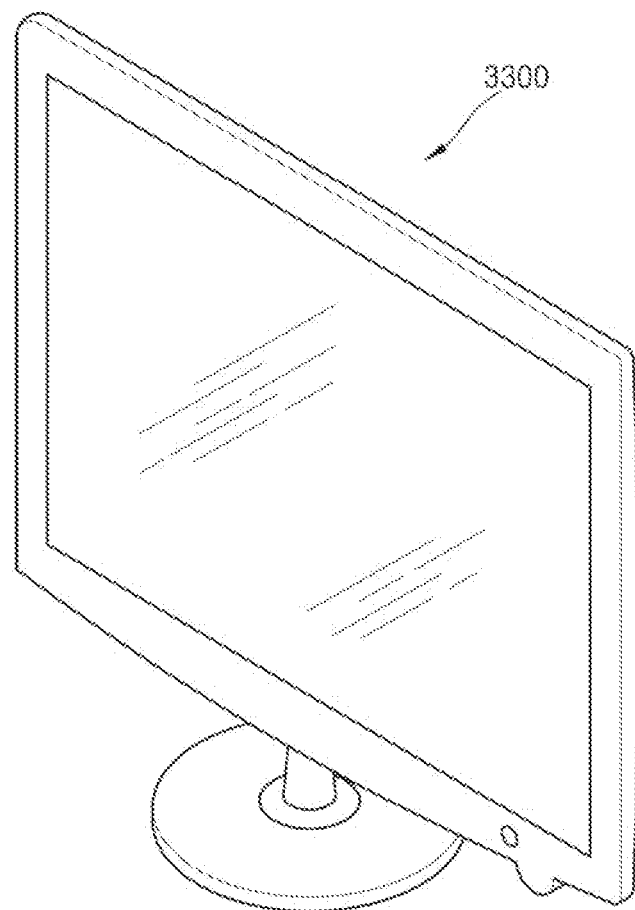

In addition, according to example embodiments, an image sensor may be applied to a mobile phone or smart phone 3000 as shown in FIG. 21, a tablet or smart tablet 3100 as shown in FIG. 22, a laptop computer 3200 as shown in FIG. 23, or a television or smart television 3300 as shown in FIG. 24. For example, the smart phone 3000 or the smart tablet 3100 may include a plurality of high-resolution cameras each equipped with a high-resolution image sensor. The high-resolution cameras may be used to extract information about the depths of objects in an image, adjust out-of-focus images, or automatically detect objects in an image.

Figure 25:
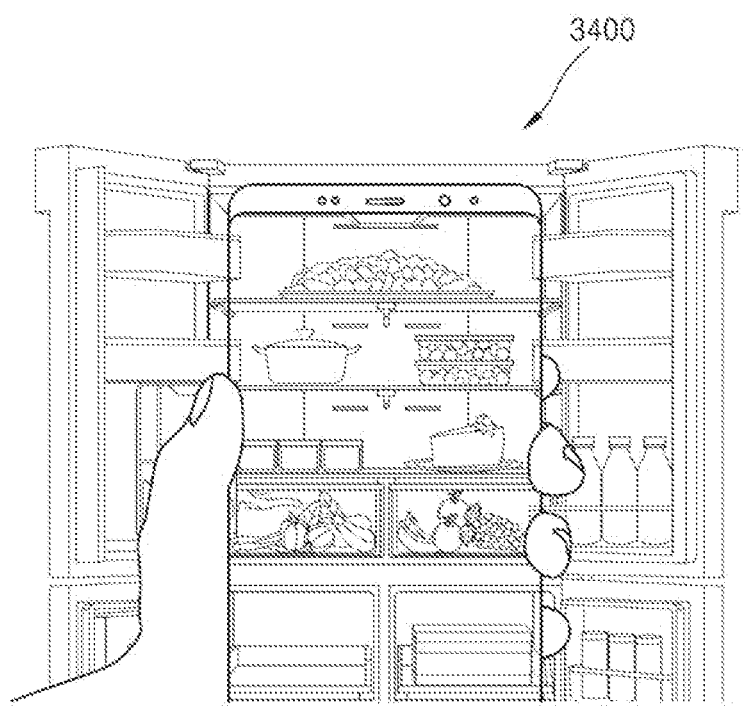
Figure 26:
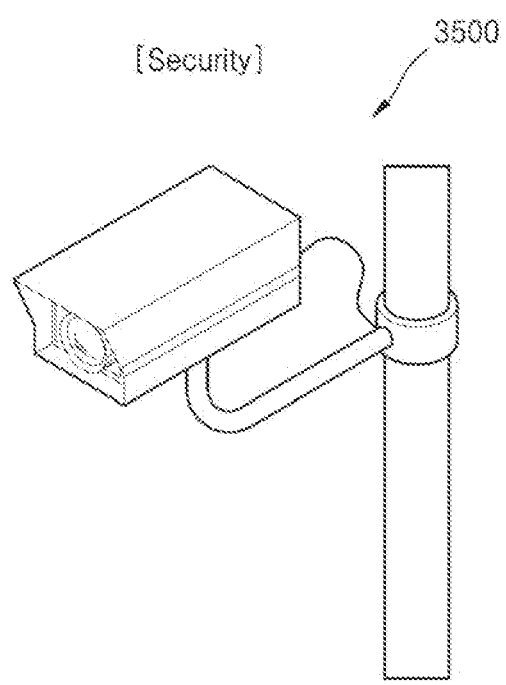
Figure 27:
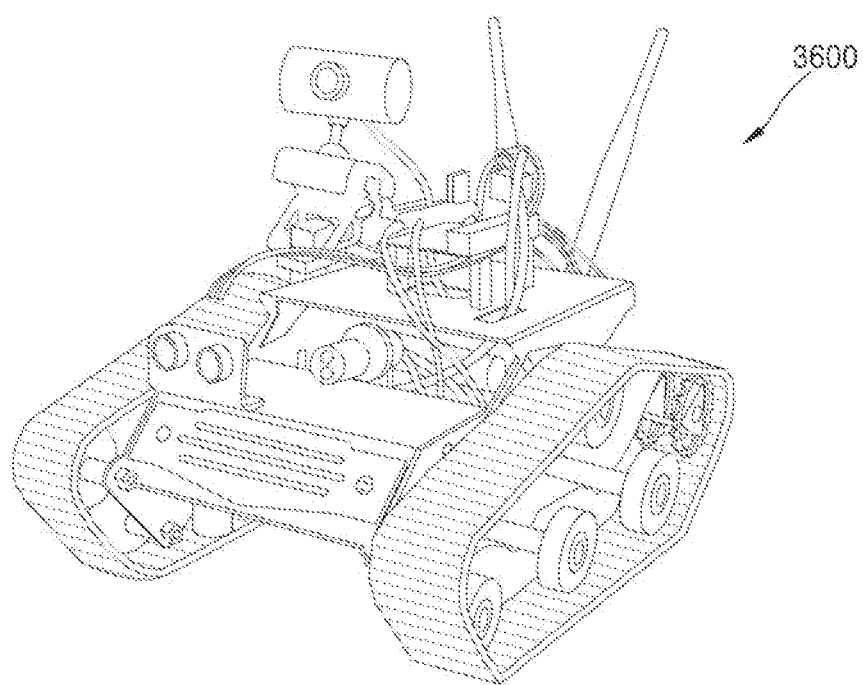
Figure 28:
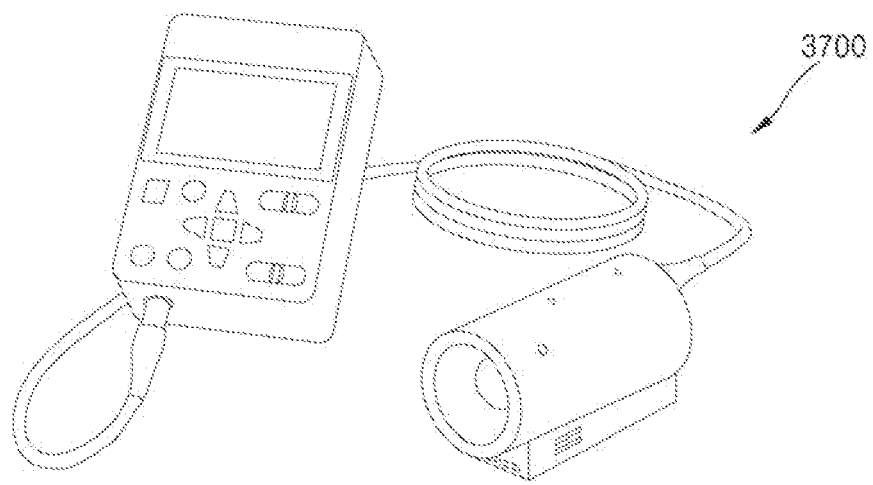

In addition, the image sensor may be applied to a smart refrigerator 3400 as shown in FIG. 25, a security camera 3500 as shown in FIG. 26, a robot 3600 as shown in FIG. 27, a medical camera 3700 as shown in FIG. 28, or the like. For example, the smart refrigerator 3400 may automatically recognize foods stored in the smart refrigerator 3400 by using the image sensor and may provide information about the foods stored in the smart refrigerator 3400 and information about foods put into or taken out of the smart refrigerator 3400 to a user through a smartphone of the user. The security camera 3500 may provide ultra-high resolution images and may be highly sensitive to enable the detection of objects or people even in images captured in dark environments. The robot 3600 may be sent to disaster or industrial sites that humans cannot directly access and may provide high-resolution images of the sites. The medical camera 3700 may provide high-resolution images for diagnosis or surgery and may have a function of dynamically adjusting a field of view.

Figure 29:
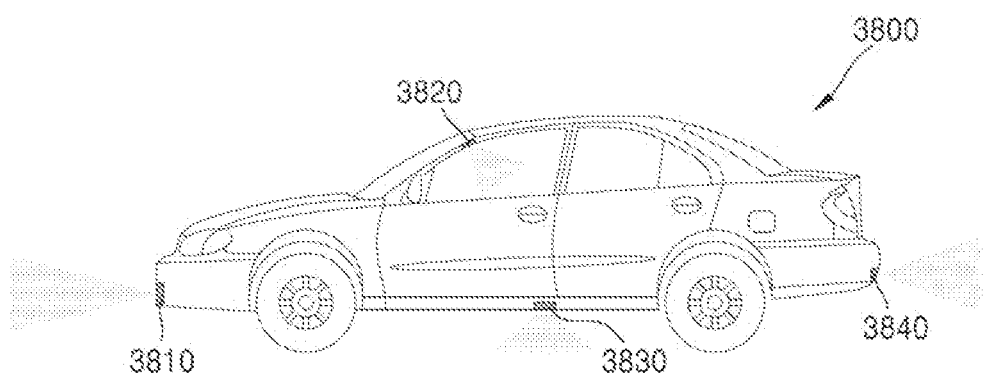

In addition, the image sensor may be applied to a vehicle 3800 as shown in FIG. 29. For example, the vehicle 3800 may include a plurality of vehicle cameras 3810, 3820, 3830, and 3840 arranged at various positions. Each of the vehicle cameras 3810, 3820, 3830, and 3840 may include an image sensor according to an example embodiment. The vehicle 3800 may provide various information about the interior or surroundings of the vehicle 3800 to a driver by using the vehicle cameras 3810, 3820, 3830, and 3840, and may provide information for autonomous driving by automatically recognizing objects or people in images.

While image sensors including color separation lens arrays, and electronic devices including the image sensors have been described according to example embodiments with reference to the accompanying drawings, the image sensors and the electronic devices are merely examples, and it will be understood by those of ordinary skill in the art that various changes and equivalent other embodiments may be made therefrom. Therefore, the example embodiments described herein should be considered in a descriptive sense only and not for purposes of limitation. The scope of the present disclosure is defined not by the above description but by the following claims, and all differences within equivalent ranges of the scope of the present disclosure should be considered as being included in the scope of the present disclosure.

As described above, according to the one or more of the above example embodiments, the image sensor is capable of adjusting the optical distance between the light detector and the color separation lens array configured to split incident light according to the wavelength of the incident light.

Because the image sensor acquires optical information from different spectra formed according to a plurality of optical distances, the image sensor may have reproducibility with high spectroscopic sensitivity compared to the case of using only three colors: red, green, and blue.

The photographing device employing the image sensor may provide high-quality images.

It should be understood that example embodiments described herein should be considered in a descriptive sense only and not for purposes of limitation. Descriptions of features or aspects within each embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. An image sensor comprising:
   a light detector comprising a plurality of photosensitive cells configured to sense light;
   a color separation lens array provided above the light detector and comprising a plurality of pattern structures, the color separation lens array being configured to collect light having different wavelength spectra respectively on at least two photosensitive cells of the plurality of photosensitive cells;
   a processor; and
   a variable interlayer element configured to adjust an optical distance between the light detector and the color separation lens array according to a signal from the processor.

2. The image sensor of claim 1, wherein the variable interlayer element is further configured to adjust a physical distance between the light detector and the color separation lens array.

3. The image sensor of claim 2, wherein the variable interlayer element comprises a microelectromechanical system actuator configured to drive a position of the color separation lens array.

4. The image sensor of claim 2, wherein the variable interlayer element comprises:
   a variable shape structure comprising a variable shape material that is variable in shape according to an electrical signal applied thereto; and
   a signal application unit configured to apply the electrical signal to the variable shape structure.

5. The image sensor of claim 4, wherein the variable shape material comprises a shape memory alloy or an electro-active polymer.

6. The image sensor of claim 2, wherein the variable interlayer element comprises:
   a frame structure comprising a variable height region, provided with a stretchable membrane, and a reservoir region in which an optical fluid to be introduced into the variable height region is stored; and
   a signal application unit configured to apply a signal to move the optical fluid between the reservoir region and the variable height region for stretching or shrinking the stretchable membrane.

7. The image sensor of claim 1, wherein the variable interlayer element comprises:
   a variable refractive index layer having a refractive index that is variable according to an electrical signal applied thereto; and
   a signal application unit configured to apply the electrical signal to the variable refractive index layer.

8. The image sensor of claim 7, wherein the variable refractive index layer comprises $LiNbO_3$, $LiTaO_3$, potassium tantalate niobite (KTN), lead zirconate titanate (PZT), $VO_2$, $VO_2O_3$, EuO, MnO, CoO, $CoO_2$, $LiCoO_2$, $Ca_2RuO_4$, or liquid crystal.

9. The image sensor of claim 1, wherein the processor is further configured to:
   control the variable interlayer element to form a plurality of optical distances that are different from each other, and
   obtain image data by processing signals sensed by the light detector respectively at the plurality of optical distances.

10. The image sensor of claim 9, wherein the processor is configured to perform computations on the image data by using spectrum data set according to the optical distances for the color separation lens array.

11. The image sensor of any claim 1, wherein the color separation lens array comprises a plurality of regions respectively facing the plurality of photosensitive cells of the light detector and comprising at least one pattern structure, and
   the plurality of regions are configured to collect light having different wavelength spectra respectively on adjacent photosensitive cells of the plurality of photosensitive cells.

12. The image sensor of claim 11, wherein the plurality of regions comprise a first region, a second region, a third region, and a fourth region which each comprise at least one of the plurality of pattern structures, and
   the plurality of photosensitive cells comprise first photosensitive cell, second photosensitive cell, third photosensitive cell, and fourth photosensitive cell which face the first region, the second region, the third region, and the fourth region, respectively.

13. The image sensor of claim 12, wherein the image sensor has a pixel arrangement structure in which a plurality of unit pixels are arranged in a Bayer pattern according to the optical distance and the plurality of unit pixels comprise red, green, and blue pixels.

14. The image sensor of claim 12, wherein shapes, arrangements, and sizes of pattern structures respectively provided in the first region, the second region, the third region, and the fourth region are determined such that immediately after passing through the color separation lens array, light having a first wavelength has a phase difference of $2N\pi$ at positions corresponding to a center portion of the first photosensitive cell and a center portion of the fourth photosensitive cell and a phase difference of $(2N-1)\pi$ at positions corresponding to center portion of the second photosensitive cell and a center portion of the third photosensitive cell, where N is an integer greater than 0.

15. The image sensor of claim 12, wherein shapes, arrangements, and sizes of pattern structures respectively provided in the first region, the second region, the third region, and the fourth region are determined such that immediately after passing through the color separation lens array, light having a second wavelength has a phase difference of $2M\pi$ at a position corresponding to a center portion of the second photosensitive cell, a phase difference of $(2M-1)\pi$ at positions corresponding to a center portion of the first photosensitive cell and a center portion of the fourth photosensitive cell, and a phase difference of greater than $(2M-2)\pi$ and less than $(2M-1)\pi$ at a position corresponding to a center portion of the third photosensitive cell, where M is an integer greater than 0.

16. The image sensor of claim 12, wherein shapes, arrangements, and sizes of pattern structures respectively provided in the first region, the second region, the third region, and the fourth region are determined such that immediately after passing through the color separation lens array, light having a third wavelength has a phase difference of $2\pi$ at a position corresponding to a center portion of the third photosensitive cell, a phase difference of $(2L-1)\pi$ at positions corresponding to a center portions of the first photosensitive cell and a center portion of the fourth photosensitive cell, and a phase difference of greater than $(2L-2)\pi$ and less than $(2L-1)\pi$ at a position corresponding to a center portion of the second photosensitive cell, where L is an integer greater than 0.

17. The image sensor of claim 12, wherein the plurality of pattern structures comprise a plurality of nano-posts, and
nano-posts provided in the first region, nano-posts provided in the second region, nano-posts provided in the third region, and nano-posts provided in the fourth region are different from each other in at least one of shape, size, and arrangement.

18. The image sensor of claim 17, wherein nano-posts, which are provided in regions corresponding to green pixel among the first region, the second region, the third region, and the fourth region, are arranged according to distribution rules that are different in a first direction and a second direction perpendicular to the first direction.

19. The image sensor of claim 18, wherein nano-posts, which are provided in regions corresponding to blue and red pixels among the first region, the second region, the third region, and the fourth region, are arranged according to symmetrical distribution rules in the first direction and the second direction.

20. The image sensor of claim 12, wherein the plurality of pattern structures comprise a first pattern structure, a second pattern structure, a third pattern structure, and a fourth pattern structure formed in the first region, the second region, the third region, and the fourth region, respectively.

21. The image sensor of claim 20, wherein the first pattern structure comprises a first dielectric having a first refractive index and provided in a first form, and a second dielectric having a second refractive index less than the first refractive index and filled in gaps of the first dielectric provided in the first form, and
the first dielectric is present in any vertical cross-section of the first pattern structure.

22. The image sensor of claim 20, wherein the first region and the fourth region correspond to green pixel, the second region corresponds to blue pixel, and the third region corresponds to red pixel, and
wherein the first pattern structure and the fourth pattern structure have a 2-fold symmetrical form, the second pattern structure and the third pattern structure have a 4-fold symmetrical form, and the fourth pattern structure has a form rotated 90 degrees with respect to the first pattern structure.

23. A photographing device comprising:
an imaging unit configured to form an optical image by condensing light reflected from an object; and
an image sensor configured to convert the optical image formed by the imaging unit into an electrical signal,
wherein the image sensor comprises:
a light detector comprising a plurality of photosensitive cells configured to sense light;
a color separation lens array provided above the light detector and comprising a plurality of pattern structures, the color separation lens array being configured to collect light having different wavelength spectra respectively on at least two photosensitive cells of the plurality of photosensitive cells; and
a variable interlayer element configured to adjust an optical distance between the light detector and the color separation lens array based on a received distance signal.

24. An electronic device comprising a photographing device, the photographing device comprising:
an imaging unit configured to form an optical image by condensing light reflected from an object; and
an image sensor configured to convert the optical image formed by the imaging unit into an electrical signal,
wherein the image sensor comprises:
a light detector comprising a plurality of photosensitive cells configured to sense light;
a color separation lens array provided above the light detector and comprising a plurality of pattern structures, the color separation lens array being configured to collect light having different wavelength spectra respectively on at least two photosensitive cells of the plurality of photosensitive cells; and
a variable interlayer element configured to adjust an optical distance between the light detector and the color separation lens array based on a received distance signal.

* * * * *